(12) United States Patent
Fujimoto

(10) Patent No.: US 6,573,015 B2
(45) Date of Patent: Jun. 3, 2003

(54) METHOD OF MEASURING OPTICAL ABERRATION

(75) Inventor: Masashi Fujimoto, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/255,700

(22) Filed: Sep. 27, 2002

(65) Prior Publication Data

US 2003/0027065 A1 Feb. 6, 2003

Related U.S. Application Data

(62) Division of application No. 09/797,589, filed on Mar. 5, 2001.

(30) Foreign Application Priority Data

Mar. 3, 2000 (JP) ........................................ 2000-063311

(51) Int. Cl.$^7$ ................................................. G03F 9/00
(52) U.S. Cl. ......................................................... 430/30
(58) Field of Search ........................................ 430/5, 30

(56) References Cited

U.S. PATENT DOCUMENTS

| | | | |
|---|---|---|---|
| 5,424,552 A | 6/1995 | Tsuji et al. | 250/548 |
| 5,715,089 A | 2/1998 | Shiraishi | 359/558 |
| 6,063,531 A | 5/2000 | Singh et al. | 430/30 |

FOREIGN PATENT DOCUMENTS

| | | |
|---|---|---|
| EP | 0 849 638 A2 | 6/1998 |
| JP | A 11-67631 | 8/1999 |

*Primary Examiner*—Christopher G. Young
(74) *Attorney, Agent, or Firm*—Young & Thompson

(57) ABSTRACT

The present invention provides a mask for measuring an optical aberration, the mask including at least a measuring pattern comprising plural pattern parts being separated from each other, wherein the plural pattern parts provide individual widths which are simply increased on first and second directional axes non-parallel to each other and vertical to a plane of the mask, provided that the width of each of the plural pattern parts is unchanged at least on the first and second directional axes.

27 Claims, 18 Drawing Sheets

Best Focus

Defocus

Defocus astigmation aberration image plane distortion

METHOD OF MEASURING OPTICAL ABERRATION

This application is a division of co-pending application Ser. No. 09/797,589 filed on Mar. 5, 2001, the entire contents of which are hereby incorporated by reference.

BACKGROUND OF THE INVENTION

The present invention relates to a mask for measuring an optical aberration of an optical system such as a projection exposure system and a method of measuring the optical aberration, and more particularly to a mask for measuring even function aberrations such as a spherical aberration, an astigmation aberration and an image plane distortion, and a method of measuring the even function aberrations by use of the mask.

It has been known as a method of measuring the aberration of the optical system such as optical lenses that focus position over an image plane is measured to obtain a best focus position, so that a calculation is made on the basis of an inter-relationship between the obtained best focus position and positions over the image plane. This method will hereinafter be referred to as a bast focus method. This bast focus method is conducted as follows. An optical system is an object to be measured in aberration. This target optical system is used for focusing a measurement pattern onto a pattern image on the image plane, wherein plural transfer pattern images are formed on plural image planes which are slightly or finely different in focus position over the image planes in a direction parallel to an optical axis of the optical system. The obtained pattern images on the plural image planes are then observed by a microscope such as a high magnification optical microscope or an electron microscope in order to the image plane which provides the pattern image in the best focus state. The position in the direction parallel to the optical axis of the detected image plane is measured as the best focus position. This measured best focus position is then used for operations to enable measurements to the even function aberrations such as the spherical aberration, the astigmation aberration and the image plane distortion. In accordance with the best focus method, the detection to the best focus position of the pattern image over the image plane is made by that an operator observes the pattern image through the high magnification optical microscope or the electron microscope and recognizes the pattern image, which is lowest in deformation and size-variation thereof, to be the best focus. In case of the independent test patterns, the best focus is defined to be the transferred pattern image having a size variation within a predetermined range or within a half value of the range for recognizing that a reduction of a photo-sensitive resist film formed with the transferred pattern image is not remarkable. In case of a straight line-and-space test pattern, the best focus is defined to be the transferred pattern image having straight line patterns separated from each other in addition to the above image patterns described in the above case of the independent test patterns.

The above conventional method has the following disadvantages. The operator is required to obverse all of the pattern images and compare the pattern images to each other to decide the best focus. This means it difficult to realize an automation of the measurement. This means the above conventional method is the time-consuming procedure. The accuracy in measurement depends upon the individual skills of the operators. Namely, it is difficult to realize a highly accurate measurement.

A second conventional technique for measuring the aberration of the optical system is disclosed in Japanese laid-open patent publication No. 11-237310. It is necessary to form measuring mask patterns aligned on the basis of a period or a cycle which is defined by a predetermined operational expression. Actually, however, it is difficult to form such the measuring mask patterns. A space width between the adjacent measuring mask patterns is measured by the electron microscope for the purpose of measuring the just focus position of the pattern image. The need to use the electron microscope raises the above problem.

A third conventional technique for measuring the aberration of the optical system is also disclosed in Japanese laid-open patent publication No. 10-232183. An exposure of the straight line-and-space pattern having the constant straight line-width is made to obtain the pattern image so that the aberration is measured on the basis of the difference or variation in width of the straight lines of the pattern images. This technique is to measure the comma aberration, for example, the odd function aberration but never to measure the even function aberration.

In the above circumstances, it had been required to develop a novel mask for measuring the even function aberration of the optical system and the novel measuring method free from the above problem.

SUMMARY OF THE INVENTION

Accordingly, it is an object of the present invention to provide a novel mask for measuring the even function aberration of the optical system free from the above problems.

It is a further object of the present invention to provide a novel mask for measuring the even function aberration of the optical system, wherein the mask allows a realization of an automatic measurement.

It is a still further object of the present invention to provide a novel mask for measuring the even function aberration of the optical system, wherein the mask allows a realization of measurement to the best focus position ill a short time and at a high accuracy.

It is yet a further object of the present invention to provide a novel method for measuring the even function aberration of the optical system free from the above problems.

It is a further object of the present invention to provide a novel method for measuring the even function aberration of the optical system, wherein the mask allows a realization of an automatic measurement.

It is a still further object of the present invention to provide a novel method for measuring the even function aberration of the optical system, wherein the mask allows a realization of measurement to the best focus position in a short time and at a high accuracy.

The present invention provides a mask for measuring an optical aberration, the mask including at least a measuring pattern comprising plural pattern parts being separated from each other, wherein the plural patter parts provide individual widths which are simply increased on first and second directional axes non-parallel to each other and vertical to a plane of the mask, provided that the width of each of the plural pattern parts is unchanged at least on the first and second directional axes.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
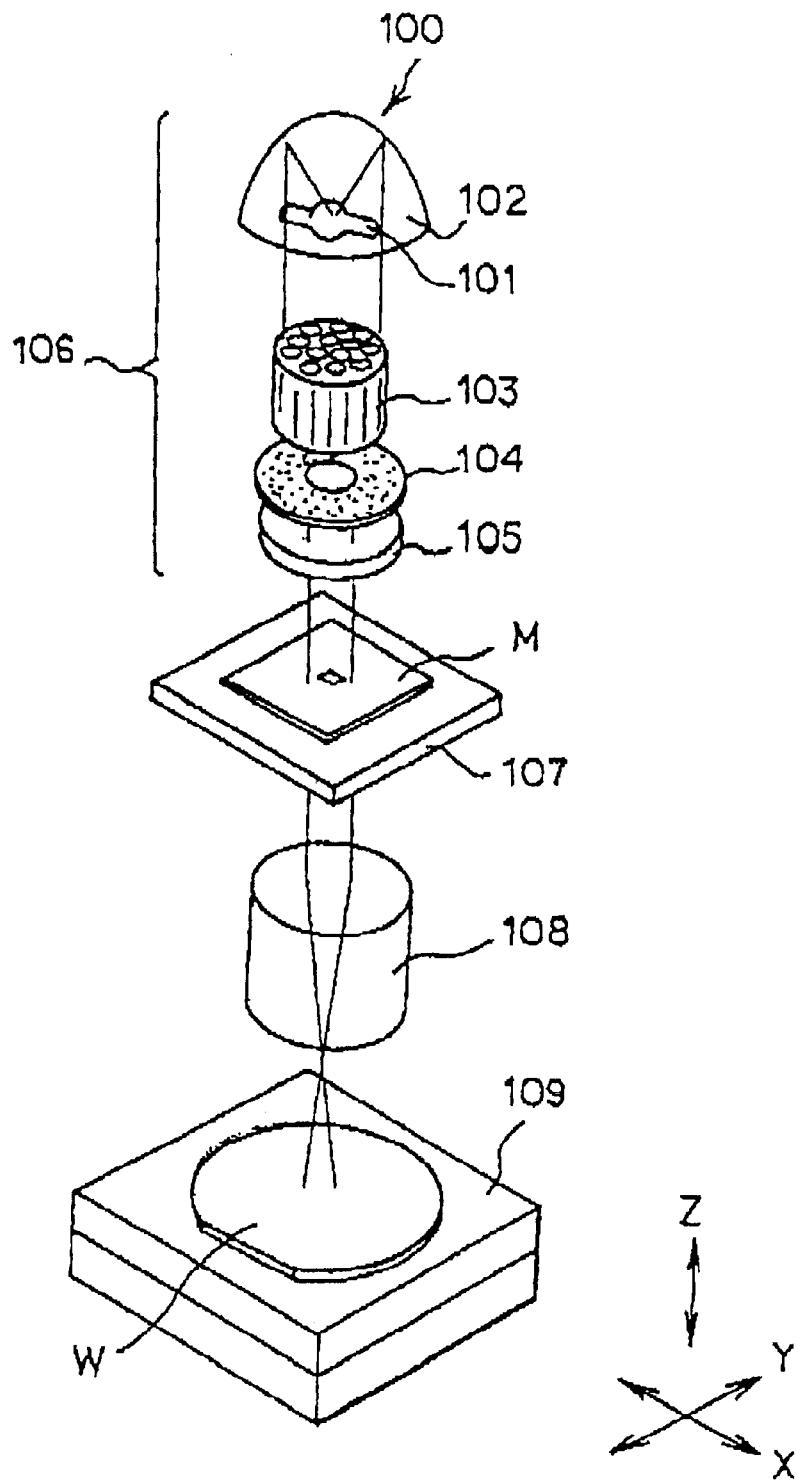
FIG. 1 is a schematic perspective view illustrative of a projection exposure system having an optical system to be measured in the even function aberration in the novel method by use of the novel measuring mask in accordance with the present invention.

The first present invention provides a mask for measuring an optical aberration, the mask including at least a measuring pattern comprising plural pattern parts being separated from each other, wherein the plural pattern parts provide individual widths which are simply increased on first and second directional axes non-parallel to each other and vertical to a plane of the mask, provided that the width of each of the plural pattern parts is unchanged at least on the first and second directional axes.

It is preferable that the mask includes plural measuring patterns having a generally uniform distribution over the mask.

It is also preferable that the plural measuring patterns are arranged in matrix over the mask.

It is also preferable that the plural measuring patterns are arranged in symmetrical with reference to a center point of the mask.

It is also preferable that the plural pattern parts include plural sets of plural width-different parallel straight line segments, provided that the plural width-different parallel straight line segments of a first set are aligned in a first direction parallel to the first directional axis, and each of the plural width-different parallel straight line segments of the first set extend in a second direction parallel to the second directional axis, and the widths of the plural width-different parallel straight line segments of the first set are simply increased in the first direction, and provided that the plural width-different parallel straight line segments of a second set are aligned in the second direction parallel to the second directional axis, and each of the plural width-different parallel straight line segments of the second set extend in the first direction parallel to the first directional axis, and the widths of the plural width-different parallel straight line segments of the second set are simply increased in the second direction.

It is also preferable that the mask includes the plural measuring patterns, and a pitch for alignment of the plural width-different parallel straight line segments of the first set in the first direction is constant for each of the plural measuring patterns and the same among the plural measuring patterns, and a pitch for alignment of the plural width-different parallel straight line segments of the second set in the second direction is also constant for each of the plural measuring patterns and the same among the plural measuring patterns.

It is also preferable that the mask includes the plural measuring patterns, and a pitch for alignment of the plural width-different parallel straight line segments of the first set in the first direction is constant for each of the plural measuring patterns and different among the plural measuring patterns, and a pitch for alignment of the plural width-different parallel straight line segments of the second set in the second direction is also constant for each of the plural measuring patterns and different among the plural measuring patterns.

It is also preferable that the plural sets of the plural width-different parallel straight line segments comprise four sets of the plural width-different parallel straight line segments which are arranged to form four sides of a square of the measuring pattern, and the first and second directional axes are perpendicular to each other.

It is also preferable that the mask includes the plural measuring patterns, and a pitch for alignment of the plural width-different parallel straight line segments of the first set in the first direction is constant for each of the plural measuring patterns and the same among the plural measuring patterns, and a pitch for alignment of the plural width-different parallel straight line segments of the second set in the second direction is also constant for each of the plural measuring patterns and the same among the plural measuring patterns.

It is also preferable that the mask includes the plural measuring patterns, and a pitch for alignment of the plural width-different parallel straight line segments of the first set in the first direction is constant for each of the plural measuring patterns and different among the plural measuring patterns, and a pitch for alignment of the plural width-different parallel straight line segments of the second set in the second direction is also constant for each of the plural measuring patterns and different among the plural measuring patterns.

It is also preferable that the plural width-different parallel straight line segments of a first pair of the four sets are arranged along first opposite sides of the square, and the first opposite sides extend in the first direction parallel to the first directional axis and the first opposite sides are distanced in the second direction parallel to the second directional axis, and the widths of the plural width-different parallel straight line segments of the first pair are increased in the same direction parallel to the first direction, and wherein the plural width-different parallel straight line segments of a second pair of the four sets are arranged along second opposite sides of the square, and the second opposite sides extend in the second direction parallel to the second directional axis and the second opposite sides are distanced in the first direction parallel to the first directional axis, and the widths of the plural width-different parallel straight line segments of the second pair are increased in the same direction parallel to the second direction.

It is also preferable that the measuring pattern further comprises four outer broad straight line segments in addition to the four sets of the plural width-different parallel straight line segments, wherein the four outer broad straight line segments respectively extend in parallel to the four sides of the square, and each of the four outer broad straight line segments extends outside of and in parallel to corresponding one set of the plural width-different parallel straight line segments, so that the four outer broad straight line segments form an outer square which surrounds the square of the four sets of the plural width-different parallel straight line segments, provided that each of the four outer broad straight line segments has a broader width than any of the plural width-different parallel straight line segments.

It is also preferable that the plural width-different parallel straight line segments of a first pair of the four sets are arranged along first opposite sides of the square, and the first opposite sides extend in the first direction parallel to the first directional axis and the first opposite sides are distanced in the second direction parallel to the second directional axis, and the widths of the plural width-different parallel straight line segments of the first pair are increased in opposite directions to each other and parallel and anti-parallel to the first direction, and wherein the plural width-different parallel straight line segments of a second pair of the four sets are arranged along second opposite sides of the square, and the second opposite sides extend in the second direction parallel to the second directional axis and the second opposite sides are distanced in the first direction parallel to the first directional axis, and the widths of the plural width-different parallel straight line segments of the second pair are increased in opposite directions to each other and parallel and anti-parallel to the second direction.

It is also preferable that the plural sets of the plural width-different parallel straight line segments comprise two sets of the plural width-different parallel straight line segments which are arranged to form adjacent two sides of a square of the measuring pattern, and the first and second directional axes are perpendicular to each other.

It is also preferable that the mask includes the plural measuring patterns, and a pitch for alignment of the plural width-different parallel straight line segments of the first set in the first direction is constant for each of the plural measuring patterns and the same among the plural measuring patterns, and a pitch for alignment of the plural width-different parallel straight line segments of the second set in the second direction is also constant for each of the plural measuring patterns and the same among the plural measuring patterns.

It is also preferable that the mask includes the plural measuring patterns, and a pitch for alignment of the plural width-different parallel straight line segments of the first set in the first direction is constant for each of the plural measuring patterns and different among the plural measuring patterns, and a pitch for alignment of the plural width-different parallel straight line segments of the second set in the second direction is also constant for each of the plural measuring patterns and different among the plural measuring patterns.

It is also preferable that the plural pattern parts include plural co-axially-aligned width-different looped lines, provided that an individual width of each of the plural co-axially-aligned width-different looped lines is unchanged.

It is also preferable that widths of the plural co-axially-aligned width-different looped lines are simply decreased in radially outward direction.

It is also preferable that each of the plural co-axially-aligned width-different looped lines has a circular ring shape.

It is also preferable that each of the plural co-axially-aligned width-different looped lines has a polygonal ring shape.

It is also preferable that each of the plural co-axially-aligned width-different looped lines has a hexagonal ring shape.

It is also preferable that the first and second directional axes extend to make an included angle of 45 degrees.

It is also preferable that the first and second directional axes extend to make an included angle of 22.5 degrees.

The second present invention provides a method of Use of a mask including at least a measuring pattern comprising plural pattern parts being separated from each other for projecting the at least measuring pattern through a target projecting optical system onto a resist film over a measuring wafer for measuring an optical aberration of the target projecting optical system, wherein the plural pattern parts provide individual widths which are simply increased on first and second directional axes non-parallel to each other and vertical to a plane of the mask, provided that the width of each of the plural pattern parts is unchanged at least on the first and second directional axes.

It is also preferable that the mask includes plural measuring patterns having a generally uniform distribution over the mask.

It is also preferable that the plural measuring patterns are arranged in matrix over the mask.

It is also preferable that the plural measuring patterns are arranged in symmetrical with reference to a center point of the mask.

It is also preferable that the plural pattern parts include plural sets of plural width-different parallel straight line segments, provided that the plural width-different parallel straight line segments of a first set are aligned in a first direction parallel to the first directional axis, and each of the plural width-different parallel straight line segments of the first set extend in a second direction parallel to the second directional axis, and the widths of the plural width-different parallel straight line segments of the first set are simply increased in the first direction, and provided that the plural width-different parallel straight line segments of a second set are aligned in the second direction parallel to-the second directional axis, and each of the plural width-different parallel straight line segments of the second set extend in the first direction parallel to the first directional axis, and the widths of the plural width-different parallel straight line segments of the second set are simply increased in the second direction.

It is also preferable that the mask includes the plural measuring patterns, and a pitch for alignment of the plural width-different parallel straight line segments of the first set in the first direction is constant for each of the plural measuring patterns and the same among the plural measuring patterns, and a pitch for alignment of the plural width-different parallel straight line segments of the second set in the second direction is also constant for each of the plural measuring patterns and the same among the, plural measuring patterns.

It is also preferable that the mask includes the plural measuring patterns, and a pitch for alignment of the plural width-different parallel straight line segments of the first set in the first direction is constant for each of the plural measuring patterns and different among the plural measuring patterns, and a pitch for alignment of the plural width-different parallel straight line segments of the second set in the second direction is also constant for each of the plural measuring patterns and different among the plural measuring patterns.

It is also preferable that the plural sets of the plural width-different parallel straight line segments comprise four sets of the plural width-different parallel straight line segments which are arranged to form four sides of a square of the measuring pattern, and the first and second directional axes are perpendicular to each other.

It is also preferable that the mask includes the plural measuring patterns, and a pitch for alignment of the plural width-different parallel straight line segments of the first set in the first direction is constant for each of the plural measuring patterns and the same among the plural measuring patterns, and a pitch for alignment of the plural width-different parallel straight line segments of the second set in the second direction is also constant for each of the plural measuring patterns and the same among the plural measuring patterns.

It is also preferable that the mask includes the plural measuring patterns, and a pitch for alignment of the plural width-different parallel straight line segments of the first set in the first direction is constant for each of the plural measuring patterns and different among the plural measuring patterns, and a pitch for alignment of the plural width-different parallel straight line segments of the second set in the second direction is also constant for each of the plural measuring patterns and different among the plural measuring patterns.

It is also preferable that the plural width-different parallel straight line segments of a first pair of the four sets are arranged along first opposite sides of the square, and the first opposite sides extend in the first direction parallel to the first directional axis and the first opposite sides are distanced in the second direction parallel to the second directional axis, and the widths of the plural width-different parallel straight line segments of the first pair are increased in the same direction parallel to the first direction, and wherein the plural width-different parallel straight line segments of a second pair of the four sets are arranged along second opposite sides of the square, and the second opposite sides extend in the second direction parallel to the second directional axis and the second opposite sides are distanced in the first direction parallel to the first directional axis, and the widths of the plural width-different parallel straight line segments of the second pair are increased in the same direction parallel to the second direction.

It is also preferable that the measuring pattern further comprises four outer broad straight line segments in addition to the four sets of the plural width-different parallel straight line segments, wherein the four outer broad straight line segments respectively extend in parallel to the four sides of the square, and each of the four outer broad straight line segments extends outside of and in parallel to corresponding one set of the plural width-different parallel straight line segments, so that the four outer broad straight line segments form an outer square which surrounds the square of the four sets of the plural width-different parallel straight line segments, provided that each of the four outer broad straight line segments has a broader width than any of the plural width-different parallel straight line segments.

It is also preferable that the plural width-different parallel straight line segments of a first pair of the four sets are arranged along first opposite sides of the square, and the first opposite sides extend in the first direction parallel to the first directional axis and the first opposite sides are distanced in the second direction parallel to the second directional axis, and the widths of the plural width-different parallel straight line segments of the first pair are increased in opposite directions to each other and parallel and anti-parallel to the first direction, and wherein the plural width-different parallel straight line segments of a second pair of the four sets are arranged along second opposite sides of the square, and the second opposite sides extend in the second direction parallel to the second directional axis and the second opposite sides are distanced in the first direction parallel to the first directional axis, and the widths of the plural width-different parallel straight line segments of the second pair are increased in opposite directions to each other and parallel and anti-parallel to the second direction.

It is also preferable that the plural sets of the plural width-different parallel straight line segments comprise two sets of the plural width-different parallel straight line segments which are arranged to form adjacent two sides of a square of the measuring pattern, and the first and second directional axes are perpendicular to each other.

It is also preferable that the mask includes the plural measuring patterns, and a pitch for alignment of the plural width-different parallel straight line segments of the first set in the first direction is constant for each of the plural measuring patterns and the same among the plural measuring patterns, and a pitch for alignment of the plural width-different parallel straight line segments of the second set in the second direction is also constant for each of the plural measuring patterns and the same among the plural measuring patterns.

It is also preferable that the mask includes the plural measuring patterns, and a pitch for alignment of the plural width-different parallel straight line segments of the first set in the first direction is constant for each of the plural measuring patterns and different among the plural measuring patterns, and a pitch for alignment of the plural width-different parallel straight line segments of the second set in the second direction is also constant for each of the plural measuring patterns and different among the plural measuring patterns.

It is also preferable that the plural pattern parts include plural co-axially-aligned width-different looped lines, provided that an individual width of each of the plural co-axially-aligned width-different looped lines is unchanged.

It is also preferable that widths of the plural co-axially-aligned width-different looped lines are simply decreased in radially outward direction.

It is also preferable that each of the plural co-axially-aligned width-different looped lines has a circular ring shape.

It is also preferable that each of the plural co-axially-aligned width-different looped lines has a polygonal ring shape.

It is also preferable that each of the plural co-axially-aligned width-different looped lines has a hexagonal ring shape.

It is also preferable that the first and second directional axes extend to make an included angle of 45 degrees.

It is also preferable that the first and second directional axes extend to make an included angle of 22.5 degrees The third present invention provides a method of measuring an optical aberration of a target projecting optical system by use of a measuring mask having measuring patterns, wherein each of the measuring patterns comprises plural pattern parts being separated from each other, and the plural pattern parts provide individual widths which are simply increased on first and second directional axes non-parallel to each other and vertical to a plane of the mask, provided that the width of each of the plural pattern parts is unchanged at least on the first and second directional axes, and wherein the method comprising the steps of: projecting the measuring patterns of the measuring mask through the target projecting optical system onto a resist film over a measuring wafer to form photo-resist patterns representing the plural pattern parts over the measuring wafer; carrying out a pattern recognition of the photo-resist patterns by irradiating a light beam onto the measuring wafer with scannings in both first and second directions parallel to the first and second directional axes to obtain pattern recognition signals for the photo-resist patterns; calculating best focus positions on the basis of the pattern recognition signals ; and calculating the optical aberration of the target optical system on the basis of the best focus positions.

It is also preferable that the optical aberration is at least one of even function aberrations.

It is also preferable that the optical aberration is an astigmation aberration.

It is also preferable that the optical aberration is an image plane distortion.

It is also preferable that the optical aberration is a spherical aberration.

It is also preferable that the mask includes plural measuring patterns having a generally uniform distribution over the mask.

It is also preferable that the plural measuring patterns are arranged in matrix over the mask.

It is also preferable that the plural measuring patterns are arranged in symmetrical with reference to a center point of the mask.

It is also preferable that the plural pattern parts include plural sets of plural width-different parallel straight line segments, provided that the plural width-different parallel straight line segments of a first set ate aligned in a first direction parallel to the first directional axis, and each of the plural width-different parallel straight line segments of the first set extend in a second direction parallel to the second directional axis, and the widths of the plural width-different parallel straight line segments of the first set are simply increased in the first direction, and provided that the plural width-different parallel straight line segments of a second set are aligned in the second direction parallel to the second directional axis, and each of the plural width-different parallel straight line segments of the second set extend in the first direction parallel to the first directional axis, and the widths of the plural width-different parallel straight line segments of the second set are simply increased in the second direction.

It is also preferable that the mask includes the plural measuring patterns, and a pitch for alignment of the plural width-different parallel straight line segments of the first set in the first direction is constant for each of the plural measuring patterns and the same among the plural measuring patterns, and a pitch for alignment of the plural width-different parallel straight line segments of the second set in the second direction is also constant for each of the plural measuring patterns and the same among the plural measuring patterns.

It is also preferable that the mask includes the plural measuring patterns, and a pitch for alignment of the plural width-different parallel straight line segments of the first set in the first direction is constant for each of the plural measuring patterns and different among the plural measuring patterns, and a pitch for alignment of the plural width-different parallel straight line segments of the second set in the second direction is also constant for each of the plural measuring patterns and different among the plural measuring patterns.

It is also preferable that the plural sets of the plural width-different parallel straight line segments comprise four sets of the plural width-different parallel straight line segments which are arranged to form four sides of a square of the measuring pattern, and the first and second directional axes are perpendicular to each other.

It is also preferable that the mask includes the plural measuring patterns, and a pitch for alignment of the plural width-different parallel straight line segments of the first set in the first direction is constant for each of the plural measuring patterns and the same among the plural measuring patterns, and a pitch for alignment of the plural width-different parallel straight line segments of the second set in the second direction is also constant for each of the plural measuring patterns and the same among the plural measuring patterns.

It is also preferable that the mask includes the plural measuring patterns, and a pitch for alignment of the plural width-different parallel straight line segments of the first set in the first direction is constant for each of the plural measuring patterns and different among the plural measuring patterns, and a pitch for alignment of the plural width-different parallel straight line segments of the second set in the second direction is also constant for each of the plural measuring patterns and different among the plural measuring patterns.

It is also preferable that the plural width-different parallel straight line segments of a first pair of the four sets are arranged along first opposite sides of the square, and the first opposite sides extend in the first direction parallel to the first directional axis and the first opposite sides are distanced in the second direction parallel to the second directional axis, and the widths of the plural width-different parallel straight line segments of the first pair are increased in the same direction parallel to the first direction, and wherein the plural width-different parallel straight line segments of a second pair of the four sets are arranged along second opposite sides of the square, and the second opposite sides extend in the second direction parallel to the second directional axis and the second opposite sides are distanced in the first direction parallel to the first directional axis, and the widths of the plural width-different parallel straight line segments of the second pair are increased in the same direction parallel to the second direction.

It is also preferable that the measuring pattern further comprises four outer broad straight line segments in addition to the four sets of the plural width-different parallel straight line segments, wherein the four outer broad straight line segments respectively extend in parallel to the four sides of the square, and each of the four outer broad straight line segments extends outside of and in parallel to corresponding one set of the plural width-different parallel straight line segments, so that the four outer broad straight line segments form an outer square which surrounds the square of the four sets of the plural width-different parallel straight line segments, provided that each of the four outer broad straight line segments has a broader width than any of the plural width-different parallel straight line segments.

It is also preferable that the plural width-different parallel straight line segments of a first pair of the four sets are arranged along first opposite sides of the square, and the first opposite sides extend in the first direction parallel to the first directional axis and the first opposite sides are distanced in the second direction parallel to the second directional axis, and the widths of the plural width-different parallel straight line segments of the first pair are increased in opposite directions to each other and parallel and anti-parallel to the first direction, and wherein the plural width-different parallel straight line segments of a second pair of the four sets are arranged along second opposite sides of the square, and the second opposite sides extend in the second direction parallel to the second directional axis and the second opposite sides are distanced in the first direction parallel to the first directional axis, and the widths of the plural width-different parallel straight line segments of the second pair are increased in opposite directions to each other and parallel and anti-parallel to the second direction.

It is also preferable that the plural sets of the plural width-different parallel straight line segments comprise two sets of the plural width-different parallel straight line segments which are arranged to form adjacent two sides of a square of the measuring pattern, and the first and second directional axes are perpendicular to each other.

It is also preferable that the mask includes the plural measuring patterns, and a pitch for alignment of the plural width-different parallel straight line segments of the first set in the first direction is constant for each of the plural measuring patterns and the same among the plural measuring patterns, and a pitch for alignment of the plural width-different parallel straight line segments of the second set in the second direction is also constant for each of the plural measuring patterns and the same among the plural measuring patterns.

It is also preferable that the mask includes the plural measuring patterns, and a pitch for alignment of the plural width-different parallel straight line segments of the first set in the first direction is constant for each of the plural measuring patterns and different among the plural measuring patterns, and a pitch for alignment of the plural width-different parallel straight line segments of the second set in the second direction is also constant for each of the plural measuring patterns and different among the plural measuring patterns It is also preferable that the plural pattern parts include plural co-axially-aligned width-different looped lines, provided that an individual width of each of the plural co-axially-aligned width-different looped lines is unchanged.

It is also preferable that widths of the plural co-axially-aligned width-different looped lines are simply decreased in radially outward direction.

It is also preferable that each of the plural co-axially-aligned width-different looped lines has a circular ring shape.

It is also preferable that each of the plural co-axially-aligned width-different looped lines has a polygonal ring shape.

It is also preferable that each of the plural co-axially-aligned width-different looped lines has a hexagonal ring shape.

It is also preferable that the fist and second directional axes extend to make an included angle of 45 degrees.

It is also preferable that the first and second directional axes extend to make an included angle of 22.5 degrees.

PREFERRED EMBODIMENT

First Embodiment

A first embodiment according to the present invention will be described in detail with reference to the drawings. FIG. 1 is a schematic perspective view illustrative of a projection exposure system having an optical system to be measured in the even function aberration in the novel method by use of the novel measuring mask in accordance with the present invention. The projection exposure system 100 has the following structure. The projection exposure system 100 has a lighting system 106 which further comprises a mercury lamp 101 for emitting a light, a reflective mirror 102 for reflecting the light emitted from the mercury lamp 101, a flay eye lens 103, a diaphragm 104 and a condenser lens 105. The reflected light is transmitted through the flay eye lens 103, the diaphragm 104 and the condenser lens 105 in this order The projection exposure system 100 also has a mask stage 107 for mounting a measuring mask M, so that the lighting system 106 realizes a light illumination to the measuring mask M. A part of the illuminated light passes through the measuring mask M. The projection exposure system 100 also has a reducing projection optical system 108 having an aberration as a measuring target The reducing projection optical system 108 may comprise a projection lens. The transmitted light through the measuring mask M is then transmitted through the projection optical system 108. The projection exposure system 100 also has a wafer stage 109, on which a measuring wafer W is placed. The light transmitted through the projection optical system 108 is finally irradiated onto the measuring wafer W. The measuring mask M has a measuring pattern. This measuring pattern of the measuring mask M is projected with size-reduction onto the surface of the measuring wafer W. A photo-resist film not illustrated is applied on the surface of the measuring wafer W. The photo-resist film over the measuring wafer W is thus exposed to the focused light with the size-reduced measuring pattern. The exposed photo-resist film is then subjected to a development to form a photo-resist pattern which represents the focused measuring pattern. The above wafer stage 109 is movable in an X-direction and a Y-direction perpendicular to the X-direction, wherein the X-direction and the Y-direction are vertical to a Z-direction which is parallel to the optical axis of the projection optical system 108. The wafer stage 109 is also movable in the Z-direction for varying the focus position with reference to the projection optical system 108. The wafer stage 109 is moved in the X-direction and the Y-direction and further in the Z-direction to obtain plural photo-resist patterns which correspond to the size-reduced focused measuring patterns which are different in focus position from each other.

Figure 2:
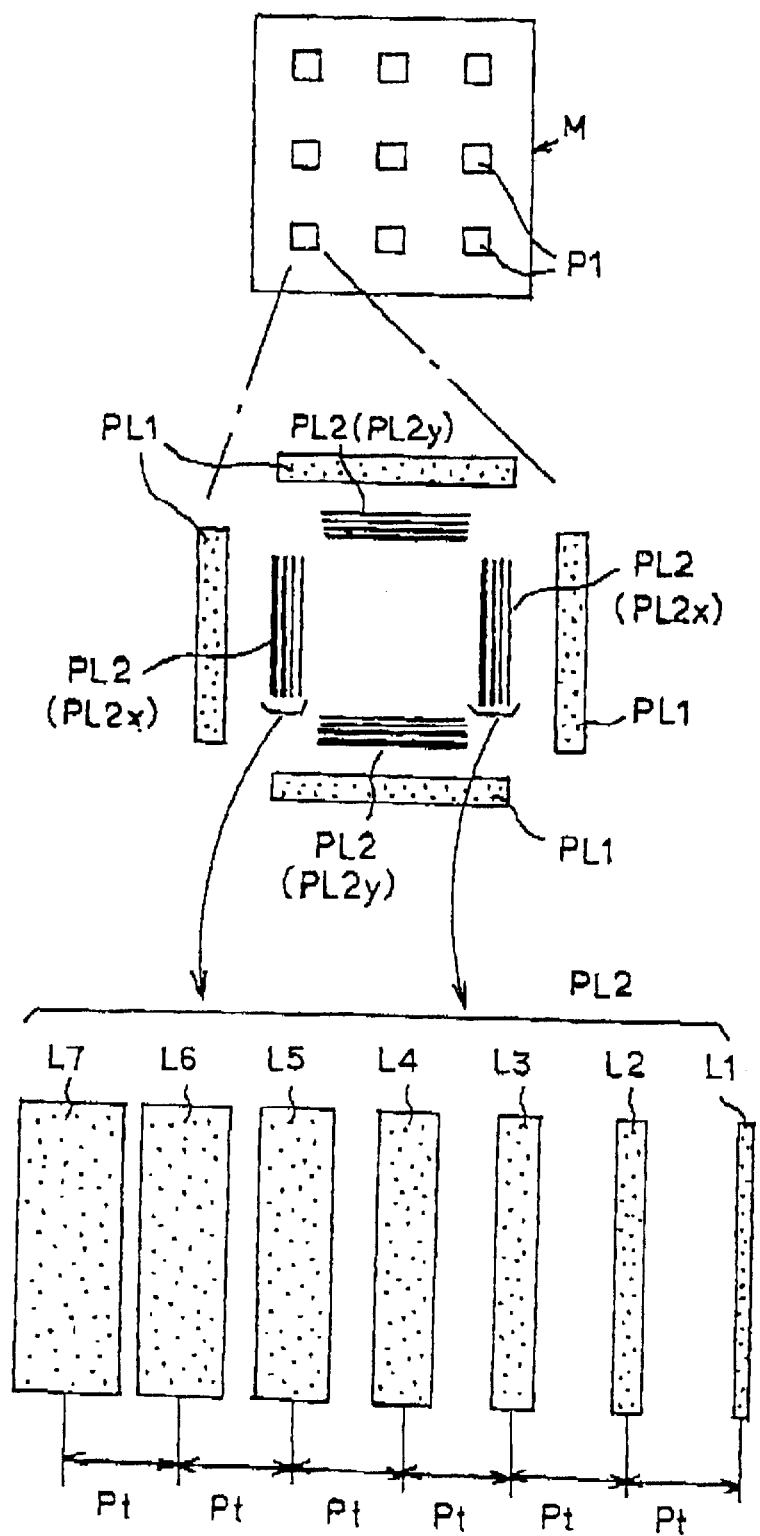
FIG. 2 is a view illustrative of a novel measuring mask M having plural measuring patterns P1, and also illustrative with enlargement of one of the plural measuring patterns P1 which comprise plural pairs of a first straight line part and a second straight line part as well as illustrative with further enlargement of one of the second straight line parts in accordance with the present invention.

FIG. 2 is a view illustrative of a novel measuring mask M having plural measuring patterns P1, and also illustrative with enlargement of one of the plural measuring patterns P1 which comprise plural pairs of a first straight line part and a second straight line part as well as illustrative with further enlargement of one of the second straight line parts in accordance with the present invention. The novel measuring mask M has a uniform distribution of plural measuring patterns P1. The uniform distribution of the plural measuring patterns P1 may, for example, comprise a matrix array of nine measuring patterns P1 as shown in FIG. 2. Each of the measuring patterns P1 may comprise a metal foil pattern of a light-shielding metal such as chromium over the surface of the body of the measuring mask M. Each of the measuring patterns P1 further comprises four pairs of a first straight line part PL1 and a second straight line part PL2, wherein first and second pairs of the first and second straight line parts PL1 and PL2 are directed in the X-direction and distanced from each other by a predetermined distance, and the remaining third and fourth pairs of the first and second straight line parts PL1 and PL2 are directed in the Y-direction perpendicular to the X-direction and distanced from each other by the same distance. The first and second pairs of the first and second straight line parts PL1 and PL2 are placed along first opposite sides of a square, whilst the third and fourth pairs of the first and second straight line parts PL1 and PL2 are placed along second opposite sides of the square. Each of the measuring patterns P1 has a shape of square which comprises four sides, wherein each of the four sides comprises a single pair of the first and second straight line parts PL1 and PL2, provided that the first straight line part PL1 is positioned outside of the second straight line part PL2 Namely, the second straight line part PL2 is positioned inside of the first straight line part PL1. The paired first and second straight line parts PL1 and PL2 are also extend in the same direction but are distanced from each other at a predetermined short distance. Thus, the four first straight line parts PL1 form an outer square, whilst the four second straight line parts PL2 form an inner square surrounded by the outer square Each of the four first straight line parts PL1 comprises a single broader straight line segment having a width of 3 micrometers. Each of the four second straight line parts PL2 comprises plural straight line segments different in width, for example, first to seventh straight line segments L1 to L7 having first to seventh widths which are different from each other. The plural straight line segments, for example, first to seventh straight line segments L1 to L7 have a uniform longitudinal direction. The plural straight line segments, for example, first to seventh straight line segments L1 to L7 are aligned in a direction perpendicular to the uniform longitudinal direction at a constant pitch Pt. The first straight line segment L1 of the second straight line part PL2 has a first width which is narrowest in all of the straight line segments of the second straight line part PL2. The second straight line segment L2 of the second straight line part PL2 has a second width which is second narrower to the first width of the first straight line segment L1. The third straight line segment L3 of the second straight line part PL2 has a third width which is third narrower to the second width of the second straight line segment L2. The second width of the second straight line segment L2 is narrower than the third width of the third straight line segment L3 and wider than the first width of the first straight line segment L1. The fourth straight line segment L4 of the second straight line part PL2 has a fourth width which is fourth narrower to the third width of the third straight line segment L3. The third width of the third straight line segment L3 is narrower than the fourth width of the fourth straight line segment L4 and wider than the second width of the second straight line segment L2. The fifth straight line segment L5 of the second straight line part PL2 has a fifth width which is fifth narrower to the fourth width of the fourth straight line segment L4 and namely the fifth width is third wider. The fourth width of the fourth straight line segment L4 is narrower than the fifth width of the fifth straight line segment L5 and wider than the third width of the third straight line segment L3. The sixth straight line segment L6 of the second straight line part PL2 has a sixth width which is sixth narrower to the fifth width of the fifth straight line segment L5 and namely the sixth width is second wider. The fifth width of the fifth straight line segment L5 is narrower than the sixth width of the sixth straight line segment L6 and wider than the fourth width of the fourth straight line segment L4. The seventh straight line segment L7 of the second straight line part PL2 has a seventh width which is seventh narrower to the sixth width of the sixth straight line segment L6 and namely the seventh width is the widest in all of the straight line segments of the second straight line part PL2. The sixth width of the sixth straight line segment L6 is narrower than the seventh width of the seventh straight line segment L7 and wider than the fifth width of the fifth straight line segment L5. Accordingly, the first to seventh straight line segments L1, L2, L3, L4, L5, L6 and L7 are aligned in the order of the width thereof from the narrowest width to the widest width, however, at the constant pitch Pt and at various gaps between adjacent ones of the first to seventh straight line segments L1, L2, L3, L4, L5, L6 and L7. The widths of the seven straight line segments vary to increase in the direction from the first straight line segment L1 to the seventh straight line segment L7, whilst the gaps between the seven straight line segments vary to decrease in the direction from the first straight line segment L1 to the seventh straight line segment L7, provided that the alignment pitch of the seven straight line segments remains unchanged. The second straight line parts PL2, each of which comprises the plural straight line segments having the first longitudinal direction parallel to the X-direction, have the same alignment direction in the order from the first straight line segment L1 to the seventh straight line segment L7. The third and fourth straight line parts PL2, each of which comprises the plural straight line segments having the second longitudinal direction parallel to the Y-direction, also have the same alignment direction in the order from the first straight line segment L1 to the seventh straight line segment L7. Any of the first to seventh straight line segments L1 to L7 of each of the second straight line part PL2 is narrower than the width of the single straight line segment of the first straight line part PL1. The rate of increase in width from the first straight line segment L1 to the seventh straight line segment L7 of the second straight line part PL2 may be constant. For example, the first width of the first straight line segment L1 of the second straight line part PL2 may, for example, be 0.1 micrometers. The second width of the second straight line segment L2 of the second straight line part PL2 may, for example, be 0.15 micrometers. The third width of the third straight line segment L3 of the second straight line part PL2 may, for example, be 0.2 micrometers. The fourth width of the fourth straight line segment L4 of the second straight line part PL2 may, for example, be 0.25 micrometers. The fifth width of the fifth straight line segment L5 of the second straight line part PL2 may, for example, be 0.3 micrometers. The sixth width of the sixth straight line segment L6 of the second straight line part PL2 may, for example, be 0.35 micrometers. The seventh width of the seventh straight line segment L7 of the second straight line part PL2 may, for example, be 0.4 micrometers. The constant pitch may be set at 0.5 micrometers.

As described above, the novel measuring mask M has the uniform distribution of the plural measuring patterns P1. The uniform distribution of the plural measuring patterns P1 may, for example, comprise the matrix array of the nine measuring patterns P1 as shown in FIG. 2. It is, of course, possible as a modification that the uniform distribution of the plural measuring patterns P1 may comprise a concentrically circulated distribution having a center corresponding to the optical axis of the above target projection optical system 109. It is further possible as a modification that the uniform distribution of the plural measuring patterns P1 may comprise a radial distribution from a center corresponding to the optical axis of the above target projection optical system 109. Namely, it is possible as a modification that the uniform distribution of the plural measuring patterns P1 may comprise a distribution symmetrical with the optical axis of the above target projection optical system 109.

A novel method of measuring the even function aberration by use of the above described novel measuring mask M will subsequently be described. The novel measuring mask M is placed on the mask stage 107 of the projection exposure system 100. The photo-resist applied measuring wafer W having the surface applied with the photo-resist film is also placed on the wafer stage 109. The light is illuminated through the lighting optical system 106 onto the measuring mask M having the measuring pattern P1, so that the light having the measuring pattern P1 is further transmitted through the reducing projection optical system 109 and focused onto the photo-resist film over the measuring wafer W, whereby the photo-resist film over the measuring wafer W is exposed to the focused light with the size-reduced measuring pattern. During this exposure process, the wafer stage 109 is placed under the two-dimensional movements both in the X-direction and in the Y-direction, so that the exposing position over the photo-resist film over the measuring wafer W is moved in the X-direction and the Y-direction. Further, during this exposure process, the wafer stage 109 is varied in the Z-direction parallel to the optical axis of the projection optical system 109 by a fine scale unit in a small range including a presumed best focus position. The fine scale unit may, for example, be 0.1 micrometer. The small range may, for example, be −1.0 micrometer to +1.0 micrometer. The exposures are made plural times to form plural exposed parts of the photo-resist film over the measuring wafer W.

Figure 3:
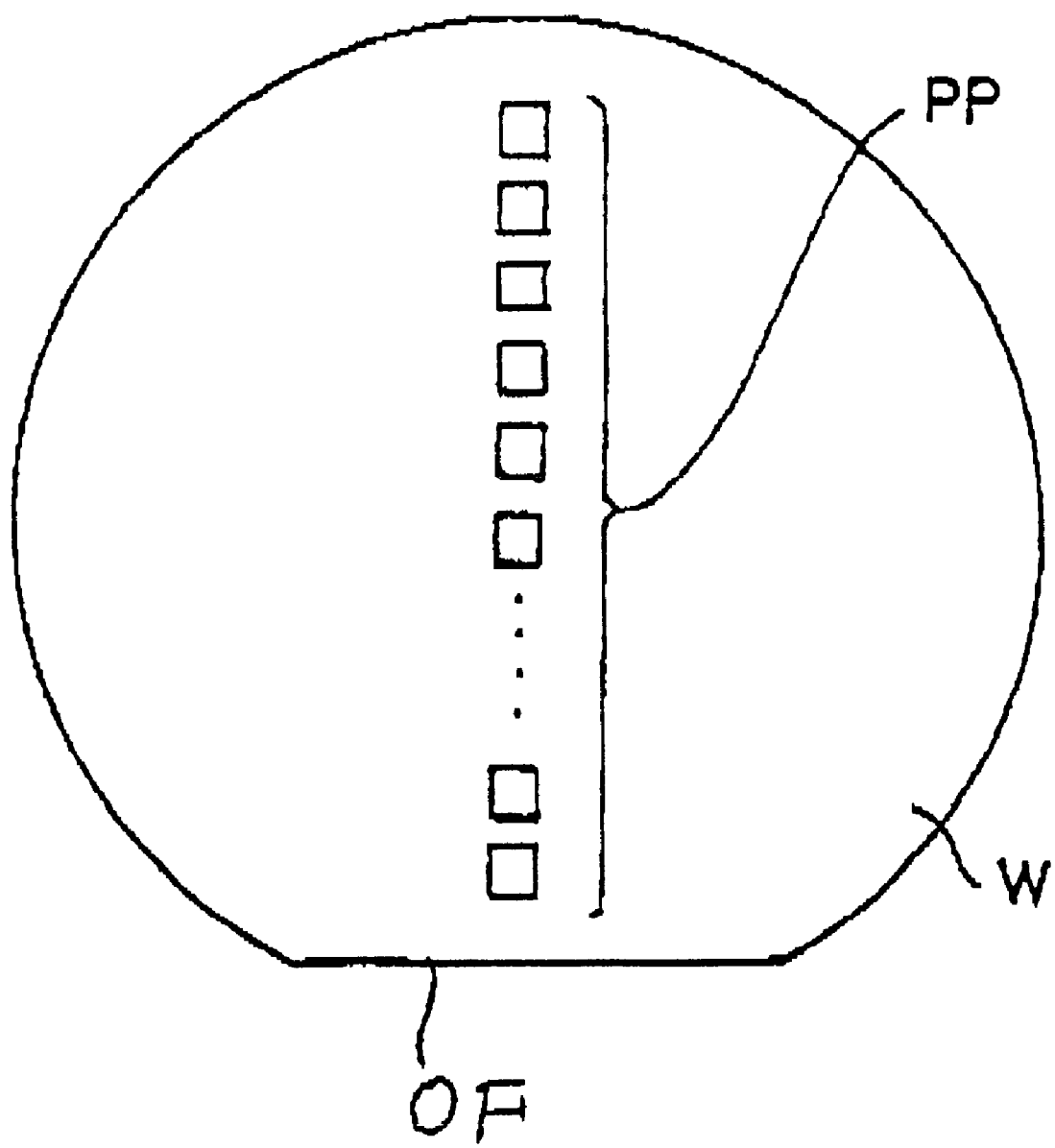
FIG. 3 is a plane view illustrative of one alignment of the photo-resist patterns PP in the direction perpendicular to the orientation flat "OF" of the measuring wafer W.

Subsequent to the exposure process, a development of the exposed photo-resist film is made to form plural photo-resist patterns PP which correspond to the size-reduced measuring patterns P1 of the measuring mask M with various focus positions. As a result, there is formed alignments of the plural photo-resist patterns PP in a direction perpendicular to the orientation flat "OF" of the measuring wafer W, wherein each alignment comprises the plural photo-resist patterns PP which are different in focus position in the Z-direction, namely different in the Z-directional position of the measuring wafer W over the wafer stage 109 under the fine movement in the Z-direction. FIG. 3 is a plane view illustrative of one alignment of the photo-resist patterns PP in the direction perpendicular to the orientation flat "OF" of the measuring wafer W. The measuring wafer W having the photo-resist patterns PP is then placed in a pattern recognition apparatus which is not illustrated for measurement to the photo-resist patterns PP. The pattern recognition apparatus irradiates an optical beam onto the photo-resist patterns PP with scanning operation over the measuring wafer W. The irradiated light onto the photo-resist patterns PP is reduced in intensity. The reflected light from the photo-resist patterns PP is lower in intensity than the reflected light from the surface of the measuring wafer W. The pattern recognition apparatus detects the intensity or the quantity of photon of the reflected light to measure the width or size of the each photo-resist pattern PP in the direction along which the light beam is scanned by the pattern recognition apparatus. As a result of the integration of the measured data, the pattern recognition is made.

Figure 4:
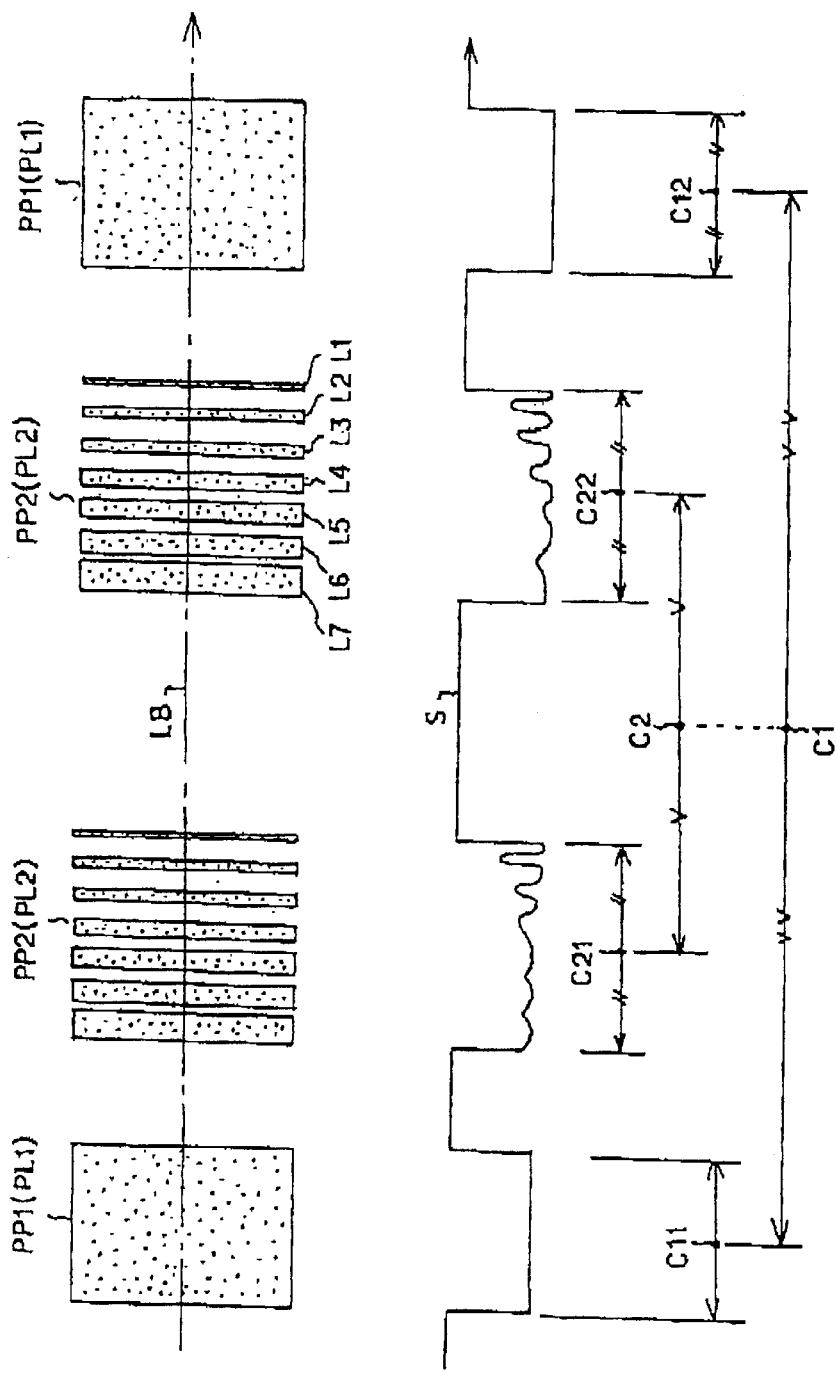
FIG. 4 is a fragmentary view illustrative of the result of the measurement to the pattern recognition of the photo-resist patterns PP over the measuring wafer W by use of the pattern recognition apparatus.

FIG. 4 is a fragmnentary view illustrative of the result of the measurement to the pattern recognition of the photo-resist patterns PP over the measuring wafer W by use of the pattern recognition apparatus with the best focus. The photo-resist patterns PP comprises the following patterns. A first type photo-resist pattern PP1 corresponds to the first straight line part PL1 of the measuring pattern P1 of the measuring mask M of FIG. 2 in such a case that the measuring pattern P1 of the measuring mask M has been exposed or projected onto the photo-resist film over the measuring wafer W. A second type photo-resist pattern PP2 corresponds to the second straight line part PL2 of the measuring pattern P1 of the measuring mask M of FIG. 2 in the best focus case. The first type photo-resist pattern PP1 corresponding to the first straight line part PL1 of the measuring pattern P1 has a first width which is narrower than the width of the first straight line part PL1 by a reduction amount which almost accords to a predetermined reduction ratio possessed by the projection optical system 109. The second type photo-resist pattern PP2 corresponding to the second straight line part PL2 of the measuring pattern P1 comprises first to seventh straight line segment photo-resist patterns L1, L2, L3, L4, L5, L6 and L7 which respectively have first, second, third, fourth, fifth, sixth and seventh widths which are also respectively narrower than the first, second, third, fourth, fifth, sixth and seventh widths of the first to seventh straight line segments L1, L2, L3, L4, L5, L6 and L7 of the second straight line part PL2 by respectively corresponding reduction amounts which almost accord to the predetermined reduction ratio possessed by the projection optical system 109. Namely, the first straight line segment photo-resist pattern L1 has the first width which is narrower than the first width of the first straight line segment L1 of the second straight line part PL2 of the measuring pattern P1 of the measuring mask M by the reduction amount which almost accords to the predetermined reduction ratio possessed by the projection optical system 109. The second straight line segment photo-resist pattern L2 has the second width which is narrower than the second width of the second straight line segment L2 of the second straight line part PL2 of the measuring pattern P1 of the measuring mask M by the reduction amount which almost accords to the predetermined reduction ratio possessed by the projection optical system 109. The third straight line segment photo-resist pattern L3 has the third width which is narrower than the third width of the third straight line segment L3 of the second straight line part PL2 of the measuring pattern P1 of the measuring mask M by the reduction amount which almost accords to the predetermined reduction ratio possessed by the projection optical system 109. The fourth straight line segment photo-resist pattern L4 has the fourth width which is narrower than the fourth width of the fourth straight line segment L4 of the second straight line part PL2 of the measuring pattern P1 of the measuring mask M by the reduction amount which almost accords to the predetermined reduction ratio possessed by the projection optical system 109. The fifth straight line segment photo-resist pattern L5 has the fifth width which is narrower than the fifth width of the fifth straight line segment L5 of the second straight line part PL2 of the measuring pattern P1 of the measuring mask M by the reduction amount which almost accords to the predetermined reduction ratio possessed by the projection optical system 109. The sixth straight line segment photo-resist pattern L6 has the sixth width which is narrower than the sixth width of the sixth straight line segment L6 of the second straight line part PL2 of the measuring pattern P1 of the measuring mask M by the reduction amount which almost accords to the predetermined reduction ratio possessed by the projection optical system 109. The seventh straight line segment photo-resist pattern L7 has the seventh width which is narrower than the seventh width of the seventh straight line segment L7 of the second straight line part PL2 of the measuring pattern P1 of the measuring mask M by the reduction amount which almost accords to the predetermined reduction ratio possessed by the projection optical system 109. The first type photo-resist pattern PP1 corresponding to the first straight line part PL1 of the measuring pattern P1 has the longitudinal direction parallel to the Y-direction perpendicular to the X-direction. The second type photo-resist pattern PP2 corresponding to the second straight line part PL2 of the measuring pattern P1 also has the longitudinal direction parallel to the Y-direction perpendicular to the X-direction, wherein the first to seventh straight line segment photo-resist patterns L1, L2, L3, L4, L5, L6 and L7 of the second type photo-resist pattern PP2 extend in the longitudinal direction parallel to the Y-direction perpendicular to the X-direction, and the first to seventh straight line segment photo-resist patterns L1, L2, L4, L5, L6 and L7 are aligned in the X-direction. The pattern recognition apparatus irradiates the light beam LB onto the surface of the measuring wafer W, wherein the light beam LB is scanned in the X-direction across over the first type photo-resist pattern PP1 and the second type photo-resist pattern PP2 comprising the first to seventh straight line segment photo-resist patterns L1, L2, L3, L4, L5, L6 and L7. The light beam LB is reflected from the surface of the measuring wafer W and the reflected light is received by the pattern recognition apparatus, and the reflected light beam LB is detected as a signal S by the pattern recognition apparatus. A first type reflected light reflected from the first and second type photo-resist patterns PP1 and PP2 is lower in intensity than a second type reflected light reflected from the surface of the measuring wafer W. Namely, when the light beam LB on scanning operation in the X-direction is irradiated onto the first and second type photo-resist patterns PP1 and PP2, then the detected signal S is low level. If the light beam LB on scanning operation in the X-direction is irradiated onto the surface of the measuring wafer W, then the detected signal S is high level. First type photo-resist pattern center positions C11 and C12 in the X-direction of the first type photo-resist patterns PP1 and PP1 can be calculated from the low level timing of the detected signal S in the scanning operation in the X-direction. Second type photo-resist pattern center positions C21 and C22 in the X-direction of the second type photo-resist patterns PP2 and PP2 can be calculated from the low level timing of the detected signal S in the scanning operation in the X-direction. A first center position C1 between the calculated first type photo-resist pattern center positions C11 and C12 in the X-direction of the first type photo-resist patterns PP1 is further calculated from the calculated first type photo-resist pattern center positions C11 and C12. A second center position C2 between the calculated second type photo-resist patter center positions C21 and C22 in the X-direction of the second type photo-resist patterns PP2 is further calculated from the calculated second type photo-resist pattern center positions C21 and C22. If the exposure was realized in the best focus state, then the first and second center positions C1 and C2 correspond to each other in the X-direction. Namely, the exposure was realized in the best focus state, then the first and second type photo-resist patterns PP1 and PP2 are free of any deformation or distortion in shape from the first and second straight line parts PL1 and PL2, respectively, For this reason, if the exposure was realized in the best focus state, then the first and second center positions C1 and C2 correspond to each other in the X-direction.

Figure 5:
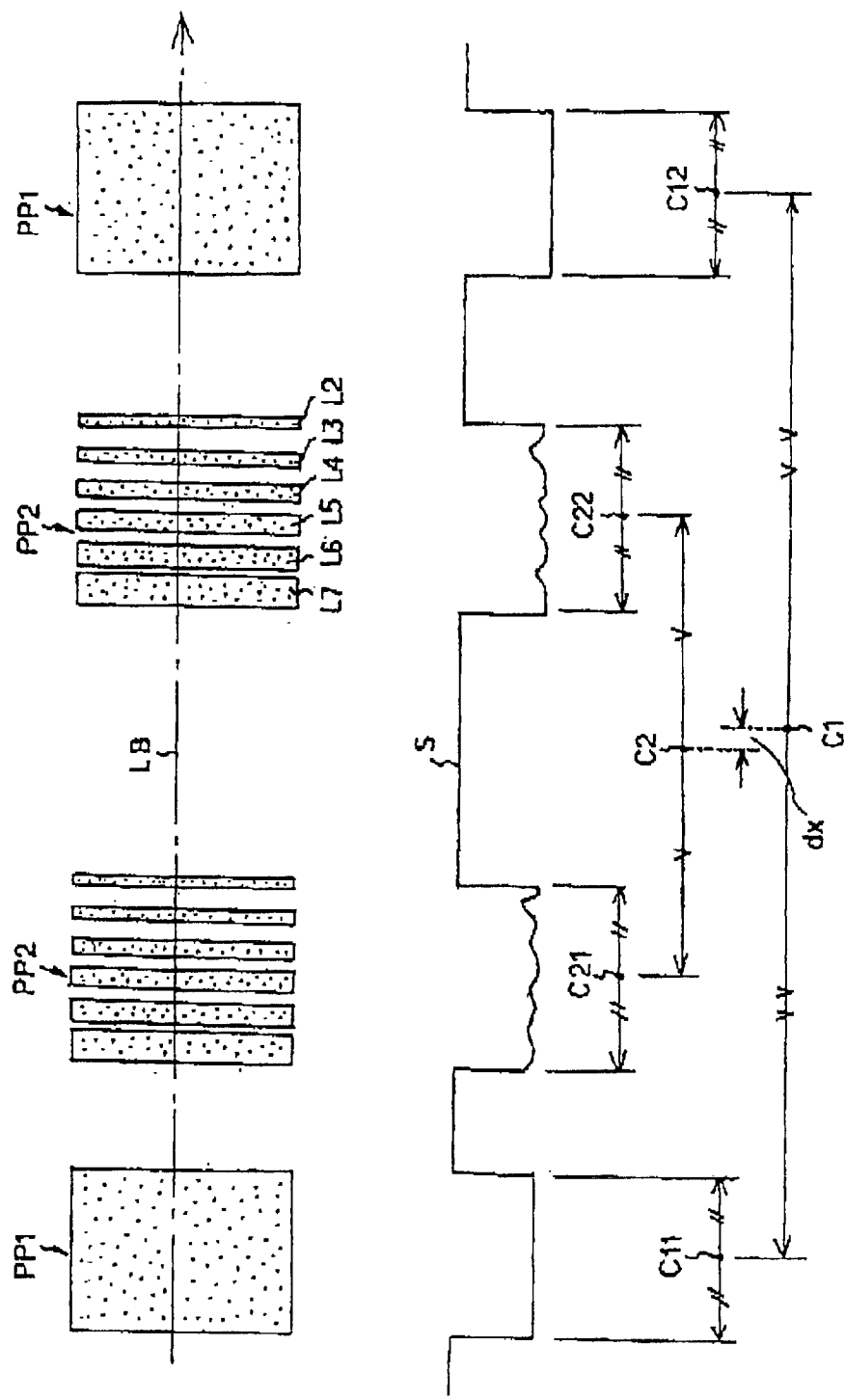
FIG. 5 is a fragmentary view illustrative of the result of the measurement to the pattern recognition of the photo-resist patterns PP over the measuring wafer W by use of the pattern recognition apparatus with the defocus.

FIG. 5 is a fragmentary view illustrative of the result of the measurement to the pattern recognition of the photo-resist patterns PP over the measuring wafer W by use of the pattern recognition apparatus with the defocus. The photo-resist patterns PP comprises the following patterns. A first type photo-resist pattern PP1 corresponds to the first straight line part PL1 of the measuring pattern P1 of the measuring mask M of FIG. 2 in such a case that the measuring pattern P1 of the measuring mask M has been exposed or projected onto the photo-resist film over the measuring wafer W. A second type photo-resist pattern PP2 corresponds to the second straight line part PL2 of the measuring pattern P1 of the measuring mask M of FIG. 2 in the defocus case. The first type photo-resist pattern PP1 corresponding to the first straight line part PL1 of the measuring pattern P1 has a first width which is narrower than the width of the first straight line part PL1 by a reduction amount which almost accords to a predetermined reduction ratio possessed by the projection optical system 109. The second type photo-resist pattern PP2 corresponding to the second straight line part PL2 of the measuring pattern P1 comprises second to seventh straight line segment photo-resist patterns L2, L3, L4, L5, L6 and L7 which respectively have second, third, fourth, fifth, sixth and seventh widths which are also respectively narrower than the second, third, fourth, fifth, sixth and seventh widths of the first to seventh straight line segments L1, L2, L3, L4, L5, L6 and L7 of the second straight line part PL2 by respectively corresponding reduction amounts which almost accord to the predetermined reduction ratio possessed by the projection optical system 109. Namely, the second straight line segment photo-resist pattern L2 has the second width which is narrower than the second width of the second straight line segment L2 of the second straight line part PL2 of the measuring pattern P1 of the measuring mask M by the reduction amount which almost accords to the predetermined reduction ratio possessed by the projection optical system 109. The third straight line segment photo-resist pattern L3 has the third width which is narrower than the third width of the third straight line segment L3 of the second straight line part PL2 of the measuring pattern P1 of the measuring mask M by the reduction amount which almost accords to the predetermined reduction ratio possessed by the projection optical system 109. The fourth straight line segment photo-resist pattern L4 has the fourth width which is narrower than the fourth width of the fourth straight line segment L4 of the second straight line part PL2 of the measuring pattern P1 of the measuring mask M by the reduction amount which almost accords to the predetermined reduction ratio possessed by the projection optical system 109. The fifth straight line segment photo-resist pattern L5 has the fifth width which is narrower than the fifth width of the fifth straight line segment L5 of the second straight line part PL2 of the measuring pattern P1 of the measuring mask M by the reduction amount which almost accords to the predetermined reduction ratio possessed by the projection optical system 109 The sixth straight line segment photo-resist pattern L6 has the sixth width which is narrower than the sixth width of the sixth straight line segment L6 of the second straight line part PL2 of the measuring pattern P1 of the measuring mask M by the reduction amount which almost accords to the predetermined reduction ratio possessed by the projection optical system 109. The seventh straight line segment photo-resist pattern L7 has the seventh width which is narrower than the seventh width of the seventh straight line segment L7 of the second straight line part PL2 of the measuring pattern P1 of the measuring mask M by the reduction amount which almost accords to the predetermined reduction ratio possessed by the projection optical system 109. The first type photo-resist pattern PP1 corresponding to the first straight line part PL1 of the measuring pattern P1 has the longitudinal direction parallel to the Y-direction perpendicular to the X-direction. The second type photo-resist pattern PP2 corresponding to the second straight line part P2 of the measuring pattern P1 also has the longitudinal direction parallel to the Y-direction perpendicular to the X-direction, wherein the second to seventh straight line segment photo-resist patterns L2, L3, L4, L5, L6 and L7 of the second type photo-resist pattern PP2 extend in the longitudinal direction parallel to the Y-direction perpendicular to the X-direction, and the second to seventh straight line segment photo-resist patterns L2, L3, L4, L5, L6 and L7 are aligned in the X-direction. The pattern recognition apparatus irradiates the light beam LB onto the surface of the measuring wafer W, wherein the light beam LB is scanned in the X-direction across over the first type photo-resist pattern PP1 and the second type photo-resist pattern PP2 comprising the second to seventh straight line segment photo-resist patterns L2, L3, L4, L5, L6 and L7. The light beam LB is reflected from the surface of the measuring wafer W and the reflected light is received by the pattern recognition apparatus, and the reflected light beam LB is detected as a signal S by the pattern recognition apparatus. A first type reflected light reflected from the first and second type photo-resist patterns PP1 and PP2 is lower in intensity than a second type reflected light reflected from the surface of the measuring wafer W. Namely, when the light beam LB on scanning operation in the X-direction is irradiated onto the first and second type photo-resist patterns PP1 and PP2, then the detected signal S is low level. If the light beam LB on scanning operation in the X-direction is irradiated onto the surface of the measuring wafer W, then the detected signal S is high level. First type photo-resist pattern center positions C11 and C12 in the X-direction of the first type photo-resist patterns PP1 and PP1 can be calculated from the low level timing of the detected signal S in the scanning operation in the X-direction. Second type photo-resist pattern center positions C21 and C22 in the X-direction of the second type photo-resist patterns PP2 and PP2 can be calculated from the low level timing of the detected signal S in the scanning operation in the X-direction. A first center position C1 between the calculated first type photo-resist pattern center positions C11 and C12 in the X-direction of the first type photo-resist patterns PP1 is further calculated from the calculated first type photo-resist pattern center positions C11 and C12. A second center position C2 between the calculated second type photo-resist pattern center positions C21 and C22 in the X-direction of the second type photo-resist patterns PP2 is further calculated from the calculated second type photo-resist pattern center positions C21 and C22. If the exposure was made in the defocus state, then the first and second center positions C1 and C2 are different from each other in the X-direction. Namely, the exposure was made in the defocus state, then the first type photo-resist pattern PP1 is free of any deformation or any certain distortion in shape from the first type photo-resist pattern PP1, but the second type photo-resist pattern PP2 includes a certain deformation or a certain distortion in shape from the straight line segments of the second straight line part P2. Particularly, the slender straight line segment of the second straight line part PL2, for example, the first straight line segment L1 of the second straight line part PL2 is likely to cause dispersion of the exposing light beam due in the defocus state, whereby the intensity of the exposing light beam to the photo-resist film is reduced. As a reduction in the intensity of the exposing light beam, it is possible that the first straight line segment L1 of the second straight line part PL2 is not projected onto the photo-resist film and the first straight line segment photo-resist pattern L1 is not formed over the measuring wafer W, even the remaining second to seventh straight line segment photo-resist patterns L2, L3, L4, L5, L6 and L7 are formed over the measuring wafer W. Since the first straight line segment photo-resist pattern L1 is not formed, then the second type photo-resist pattern PP2 comprises the second to seventh straight line segment photo-resist patterns L2, L3, L4, L5, L6 and L7 and is free of the first straight line segment photo-resist pattern L1. The width of the second type photo-resist pattern PP2 is thus defined between the outer edge of the second straight line segment photo-resist pattern L2 and the outer edge of the seventh straight line segment photo-resist pattern L7. Further, the extent in the X-direction of the second type photo-resist pattern PP2 is defined by the outer edge position of the second straight line segment photo-resist pattern L2 and the outer edge position of the seventh straight line segment photo-resist pattern L7. Namely, since the second type photo-resist pattern PP2 is exclusive of the first straight line segment photo-resist pattern L1, the extent in the X-direction of the second type photo-resist pattern PP2 is different from what is obtained in the best focus state. Thus, the calculated second center position C2 is displaced and different from the position calculated in the case of the best focus state. For this reason, if the exposure was made in the defocus state, then the first and second center positions C1 and C2 are different from each other by a displacement "dx" in the X-direction.

Figure 6:
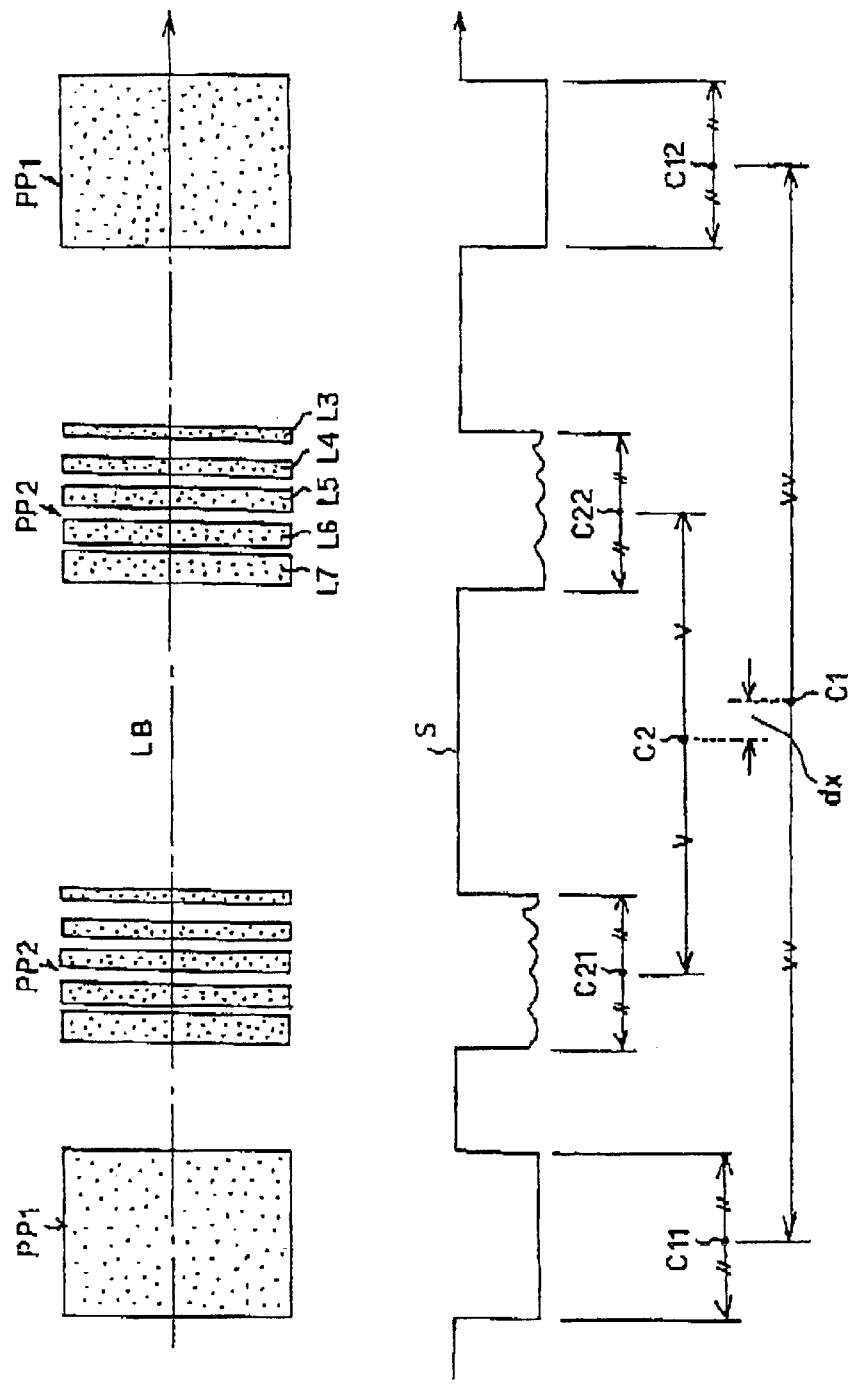
FIG. 6 is a fragmentary view illustrative of the result of the measurement to the pattern recognition of the photo-resist patterns PP over the measuring wafer W by use of the pattern recognition apparatus with the remarkable defocus.

FIG. 6 is a fragmentary view illustrative of the result of the measurement to the pattern recognition of the photo-resist patterns PP over the measuring wafer W by use of the pattern recognition apparatus with the remarkable defocus The photo-resist patterns PP comprises the following patterns. A first type photo-resist pattern PP1 corresponds to the first straight line part PL1 of the measuring pattern P1 of the measuring mask M of FIG. 2 in such a case that the measuring pattern P1 of the measuring mask M has been exposed or projected onto the photo-resist film over the measuring wafer W. A second type photo-resist pattern PP2 corresponds to the second straight line part PL2 of the measuring pattern P1 of the measuring mask M of FIG. 2 in the remarkable defocus case. The first type photo-resist pattern PP1 corresponding to the first straight line part PL1 of the measuring pattern P1 has a first width which is narrower than the width of the first straight line part PL1 by a reduction amount which almost accords to a predetermined reduction ratio possessed by the projection optical system 109. The second type photo-resist pattern PP2 corresponding to the second straight line part PL2 of the measuring pattern P1 comprises third to seventh straight line segment photo-resist patterns L3, L4, L5, L6 and L7 which respectively have third, fourth, fifth, sixth and seventh widths which are also respectively narrower than the second, third, fourth, fifth, sixth and seventh widths of the third to seventh straight line segments L3, L4, L5, L6 and L7 of the second straight line part PL2 by respectively corresponding reduction amounts which almost accord to the predetermined reduction ratio possessed by the projection optical system 109. Namely, the third straight line segment photo-resist pattern L3 has the third width which is narrower than the third width of the third straight line segment L3 of the second straight line part FL2 of the measuring pattern P1 of the measuring mask M by the reduction amount which almost accords to the predetermined reduction ratio possessed by the projection optical system 109. The fourth straight line segment photo-resist pattern L4 has the fourth width which is narrower than the fourth width of the fourth straight line segment L4 of the second straight line part PL2 of the measuring pattern P1 of the measuring mask M by the reduction amount which almost accords to the predetermined reduction ratio possessed by the projection optical system 109. The fifth straight line segment photo-resist pattern L5 has the fifth width which is narrower than the fifth width of the fifth straight line segment L5 of the second straight line part PL2 of the measuring pattern P1 of the measuring mask M by the reduction amount which almost accords to the predetermined reduction ratio possessed by the projection optical system 109. The sixth straight line segment photo-resist pattern L6 has the sixth width which is narrower than the sixth width of the sixth straight line segment L6 of the second straight line part PL2 of the measuring pattern P1 of the measuring mask M by the reduction amount which almost accords to the predetermined reduction ratio possessed by the projection optical system 109. The seventh straight line segment photo-resist pattern L7 has the seventh width which is narrower than the seventh width of the seventh straight line segment L7 of the second straight line part PL2 of the measuring pattern P1 of the measuring mask M by the reduction amount which almost accords to the predetermined reduction ratio possessed by the projection optical system 109. The first type photo-resist pattern PP1 corresponding to the first straight line part PL1 of the measuring pattern P1 has the longitudinal direction parallel to the Y-direction perpendicular to the X-direction. The second type photo-resist pattern PP2 corresponding to the second straight line part PL2 of the measuring pattern P1 also has the longitudinal direction parallel to the Y-direction perpendicular to the X-direction, wherein the third to seventh straight line segment photo-resist patterns L3, L4, L5, L6 and L7 of the second type photo-resist pattern PP2 extend in the longitudinal direction parallel to the Y-direction perpendicular to the X-direction, and the third to seventh straight line segment photo-resist patterns L3, L4, L5, L6 and L7 are aligned in the X-direction. The pattern recognition apparatus irradiates the light beam LB onto the surface of the measuring wafer W, wherein the light beam LB is scanned in the X-direction across over the first type photo-resist pattern PP1 and the second type photo-resist pattern PP2 comprising the third to seventh straight line segment photo-resist patterns L3, L4, L5, L6 and L7. The light beam LB is reflected from the surface of the measuring wafer W and the reflected light is received by the pattern recognition apparatus, and the reflected light beam LB is detected as a signal S by the pattern recognition apparatus. A first type reflected light reflected from the first and second type photo-resist patterns PP1 and PP2 is lower in intensity than a second type reflected light reflected from the surface of the measuring wafer W. Namely, when the light beam LB on scanning operation in the X-direction is irradiated onto the first and second type photo-resist patterns PP1 and PP2, then the detected signal S is low level. If the light beam LB on scanning operation in the X-direction is irradiated Onto the surface of the measuring wafer W, then the detected signal S is high level, First type photo-resist pattern center positions C11 and C12 in the X-direction of the first type photo-resist patterns PP1 and PP1 can be calculated from the low level timing of the detected signal S in the scanning operation in the X-direction. Second type photo-resist pattern center positions C21 and C22 in the X-direction of the second type photo-resist patterns PP2 and PP2 can be calculated from the low level timing of the detected signal S in the scanning operation in the X-direction. A first center position C1 between the calculated first type photo-resist pattern center positions C11 and C12 in the X-direction of the first type photo-resist patterns PP1 is further calculated from the calculated first type photo-resist pattern center positions C11 and C12. A second center position C2 between the calculated second type photo-resist pattern center positions C21 and C22 in the X-direction of the second type photo-resist patterns PP2 is further calculated from the calculated second type photo-resist pattern center positions C21 and C22. If the exposure was made in the remarkable defocus state, then the first and second center positions C1 and C2 are different from each other in the X-direction. Namely, the exposure was made in the remarkable defocus state, then the first type photo-resist pattern PP1 is free of any deformation or any certain distortion in shape from the first type photo-resist pattern PP1, but the second type photo-resist pattern PP2 includes a certain deformation or a certain distortion in shape from the straight line segments of the second straight line part P2. Particularly, the slender straight line segments of the second straight line part PL2, for example, the first and second straight line segments L1 and L2 of the second straight line part PL2 are likely to cause dispersion of the exposing light beam due in the remarkable defocus state, whereby the intensity of the exposing light beam to the photo-resist film is reduced. As a reduction in the intensity of the exposing light beam, it is possible that the first and second straight line segments L1 and L2 of the second straight line part PL2 are not projected onto the photo-resist film and the first and second straight line segment photo-resist patterns L1 and L2 are not formed over the measuring wafer W, even the remaining third to seventh straight line segment photo-resist patterns L3, L4, L5, L6 and L7 are formed over the measuring wafer W. Since the first and second straight line segment photo-resist patterns L1 and L2 are not formed, then the second type photo-resist pattern PP2 comprises the third to seventh straight line segment photo-resist patterns L3, L4, L5, L6 and L7 and is free of the first and second straight line segment photo-resist patterns L1 and L2. The width of the second type photo-resist pattern PP2 is thus defined between the outer edge of the third straight line segment photo-resist pattern L3 and the outer edge of the seventh straight line segment photo-resist pattern L7. Further, the extent in the X-direction of the second type photo-resist pattern PP2 is defined by the outer edge position of the third straight line segment photo-resist pattern L3 and the outer edge position of the seventh straight line segment photo-resist pattern L7. Namely, since the second type photo-resist pattern PP2 is exclusive of the first and second straight line segment photo-resist patterns L1 and L2, the extent in the R-direction of the second type photo-resist pattern PP2 is largely different from what is obtained in the best focus state. Thus, the calculated second center position C2 is largely displaced and different from the position calculated in the case of the best focus state. For this reason, if the exposure was made in the remarkable defocus state, then the first and second center positions C1 and C2 are largely different from each other by a large displacement "dx" in the X-direction.

As described above, it can be understood that the displacement "dx" between the first and second center positions C1 and C2 of the first and second type photo-resist patterns PP1 and PP2 depends on the magnitude of the defocus. If the exposure was made in the best focus, then the displacement "dx" is zero. Namely, if the displacement "dx" is zero, then this means that the exposure was made in the best focus. If the displacement "dx" is not zero, then this means that the exposure was made in the defocus. The displacement "dx" depends on the magnitude of the defocus. If the exposure was made at the best focus position of the measuring wafer W in the Z-direction, then the displacement "dx" is zero. If the exposure was made at a position displaced toward the projection optical system 109 from the best focus position of the measuring wafer W in the Z-direction, then the displacement "dx" is not zero. If the exposure was made at a position displaced in an opposite direction to the projection optical system 109 from the best focus position of the measuring wafer W in the Z-direction, then the displacement "dx" is also not zero. The displacement "dx" is increased by displacing the measuring wafer W in the Z-direction from the best focus position.

Figure 7:
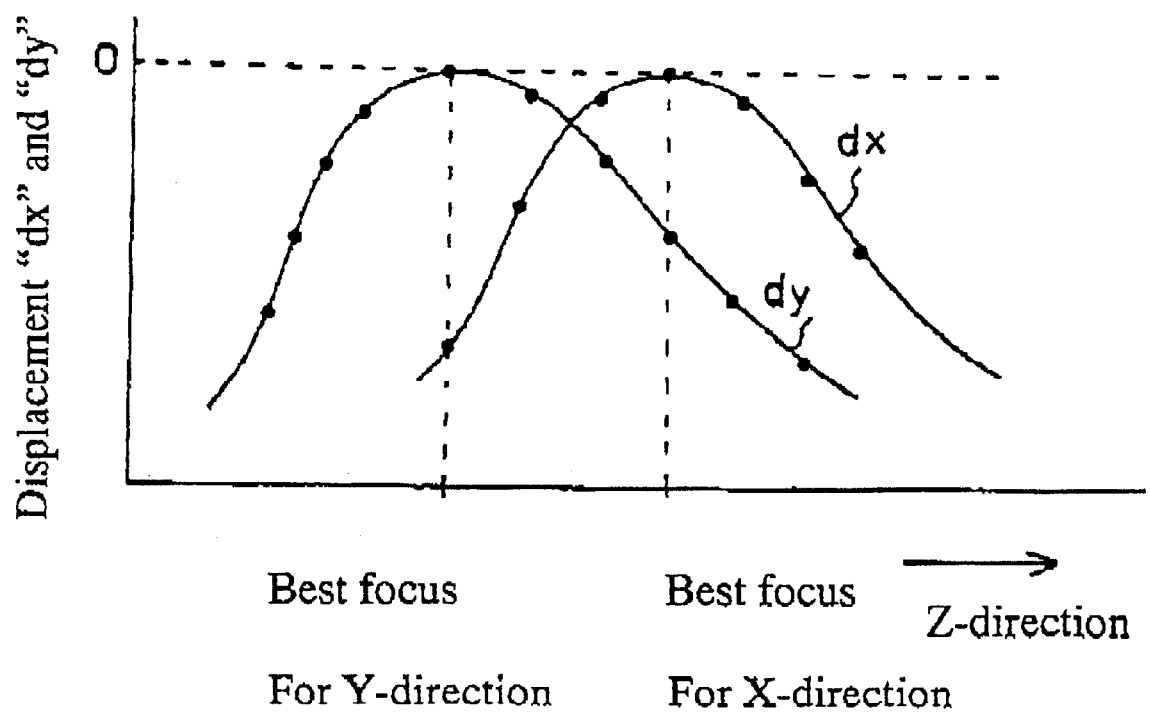
FIG. 7 is a diagram illustrative of variations in the displacements "dx" and "dy" defined between the first and second center positions C1 and C2 of the first and second type photo-resist patterns PP1 and PP2 in the X-direction and the Y-direction over the position of the measuring wafer W in the Z-direction with reference to the first best focus position in the Z-direction for the X-direction scanning, and also with reference to the second best focus position in the Z-direction for the Y-direction scanning

The above descriptions have been made by taking the X-direction as one example, but will be applied to the Y-direction. FIG. 7 is a diagram illustrative of variations in the displacements "dx" and "dy" defined between the first and second center positions C1 and C2 of the first and second type photo-resist patterns PP1 and PP2 in the X-direction and the Y-direction over the position of the measuring wafer W in the Z-direction with reference to the first best focus position in the Z-direction for the X-direction scanning, and also with reference to the second best focus position in the Z-direction for the Y-direction scanning. Usually, the projection optical system as the measuring target for the optical aberration or the even function aberration has the astigmation. In this case, the first best focus position in the Z-direction for the X-direction scanning is different from the second best focus position in the Z-direction for the Y-direction scanning. The first best focus position in the Z-direction for the X-direction scanning is obtained as follows. The light beam LB is scanned in the X-direction by the pattern recognition apparatus over the measuring wafer W for obtaining the detected signal S to calculate the first and second center positions C1 and C2 in the X-direction of the first and second type photo-resist patterns PP1 and PP2. The first displacement "dx" defined to be a difference between the first and second center positions C1 and C2 in the X-direction of the first and second type photo-resist patterns PP1 and PP2 is thus calculated in each of various cases varying the positions of the measuring wafer W in the Z-direction. The calculated values of the first displacement "dx" are then plotted in the vertical axis of the graph whilst the corresponding positions of the measuring wafer W in the Z-direction are then plotted in the horizontal axis of the graph. The peak point of the curve of the calculated values of the first displacement "dx" means the displacement free position or the first best focus position in the Z-direction for the X-direction scanning. The second best focus position in the Z-direction for the Y-direction scanning is also obtained as follows. The light beam LB is scanned in the Y-direction by the pattern recognition apparatus over the measuring wafer W for obtaining the detected signal S to calculate the first and second center positions C1 and C2 in the Y-direction of the first and second type photo-resist patterns PP1 and PP2. The second displacement "dy" defined to be a difference between the first and second center positions C1 and C2 in the Y-direction of the first and second type photo-resist patterns PP1 and PP2 is thus calculated in each of various cases varying the positions of the measuring wafer W in the Z-direction. The calculated values of the second displacement "dy" are then plotted in the vertical axis of the graph whilst the corresponding positions of the measuring wafer W in the Z-direction are then plotted in the horizontal axis of the graph. The peak point of the curve of the calculated values of the second displacement "dy" means the displacement free position or the second best focus position in the Z-direction for the Y-direction scanning.

Figure 8:
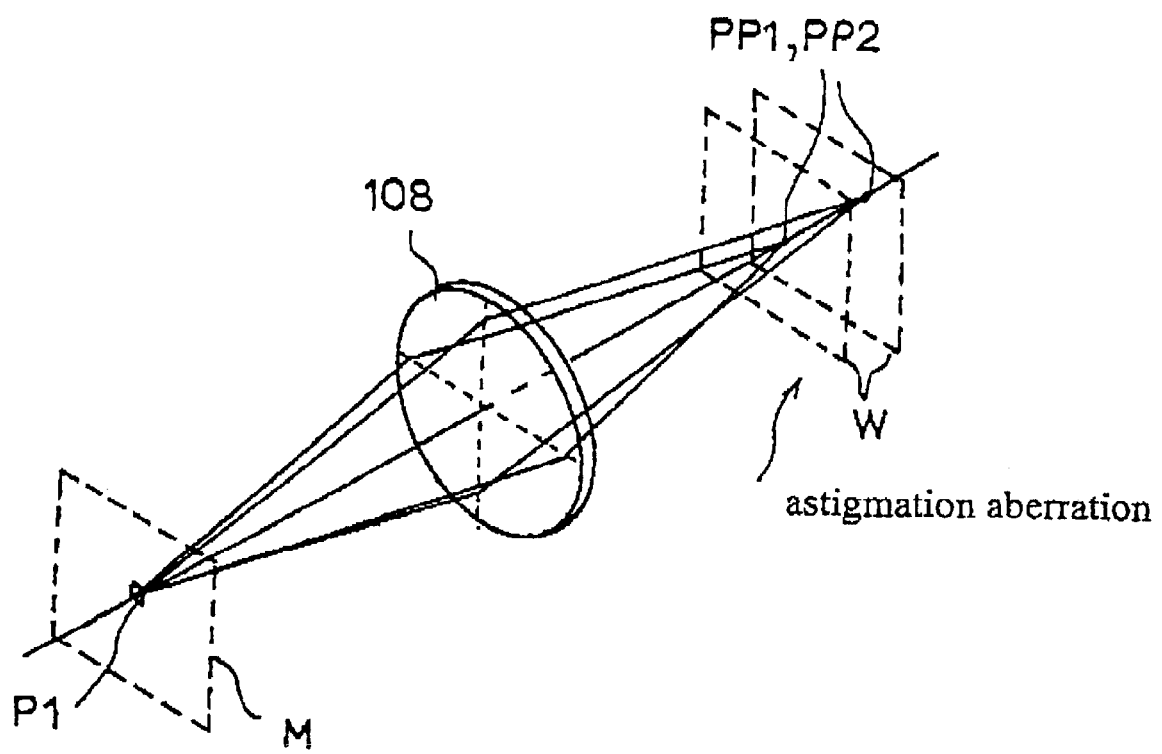
FIG. 8 is a schematic perspective view illustrative of a difference between the first and second best focus positions when obtaining the astigmation of the projection optical system as the measuring target.

FIG. 8 is a schematic perspective view illustrative of a difference between the first and second best focus positions when obtaining the astigmation of the projection optical system as the measuring target. In order to obtain the astigmation of the projection optical system as the measuring target, it is necessary to measure the first and second best focus positions of the single measuring pattern P1 only which is positioned on the optical axis of the projection optical system. As described above, if the projection optical system as the measuring target has an astigmation, then the first best focus position based on zero value of the first displacement "dx" defined to be a difference between the first and second center positions C1 and C2 in the X-direction of the first and second type photo-resist patterns PP1 and PP is different from the second best focus position based on zero value of the second displacement "dye" defined to be a difference between the first and second center positions C1 and C2 in the Y-direction of the first and second type photo-resist patterns PP1 and PP. The astigmation is calculated from a difference between the first and second best focus positions of the single measuring pattern P1 only which is positioned on the optical axis of the projection optical system. It is, of course, possible that the first averaged value of the first best focus positions for the various measuring patterns and the second averaged value of the second best focus positions of the single measuring pattern P1 only which is positioned on the optical axis of the projection optical system before the astigmation is calculated from a difference between the first and second averaged values of the first and second best focus positions.

Figure 9:
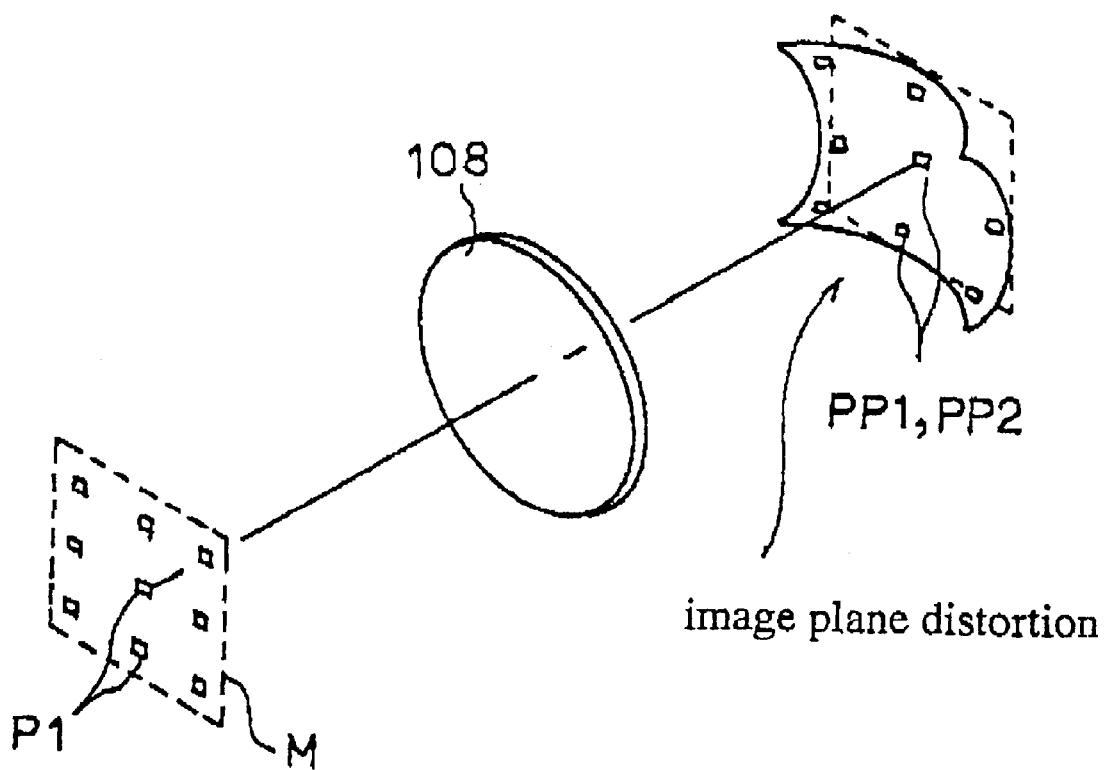
FIG. 9 is a schematic perspective view illustrative of a difference between the first and second best focus positions when obtaining the image plane distortion of the projection optical system as the measuring target.

FIG. 9 is a schematic perspective view illustrative of a difference between the first and second best focus positions when obtaining the image plane distortion of the projection optical system as the measuring target. In order to obtain the image plane distortion of the projection optical system as the measuring target, it is necessary to measure the first and second best focus positions of each of the plural measuring patterns P1 over the measuring mask M. As described above, if the projection optical system as the measuring target has an image plane distortion, then for each of the plural measuring patterns P1, the first best focus position based on zero value of the first displacement "dx" defined to be a difference between the first and second center positions C1 and C2 in the X-direction of the first and second type photo-resist patterns PP1 and PP is different from the second best focus position based on zero value of the second displacement "dy" defined to be a difference between the first and second center positions C1 and C2 in the Y-direction of the first and second type photo-resist patterns PP1 and PP. The image plane distortion is calculated from all differences between the first and second best focus positions of all of the measuring patterns P1 over the measuring mask M.

Figure 10:
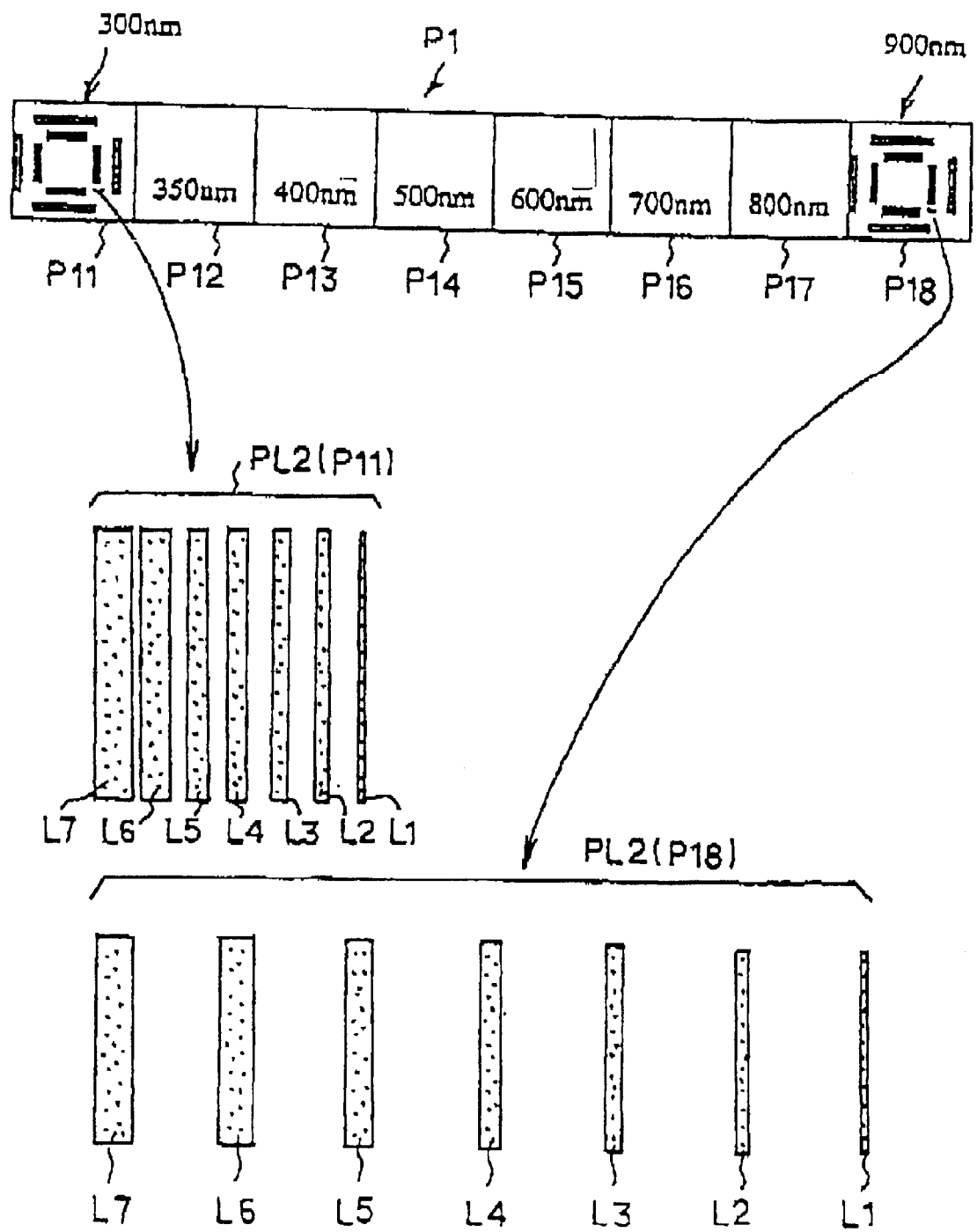
FIG. 10 is a view illustrative of an alignment of the eight measuring patterns P1 basically the same pattern as shown in FIG. 2.

In order to measure the spherical aberration, it is necessary to prepare and use a measuring mask M having plural measuring patterns, each of which has basically the same pattern as shown in FIG. 2 but the plural measuring patterns P1 are different in pitch of the first to seventh straight line segments L1, L2, L3, L4, L5, L6 and L7 of the second straight line part L2 thereof. The plural measuring patterns P1 as shown in FIG. 2 have the constant pitch, for example, 0.5 micrometers (500 nanometers) of the first to seventh straight line segments L1, L2, L3, L4, L5, L6 and L7 of the second straight line part L2. In order to measure the spherical aberration, it is necessary that the plural measuring patterns P1 are different in pitch of the first to seventh straight line segments L1, L2, L3, L4, L5, L6 and L7 of the second straight line part L2 thereof. FIG. 10 is a view illustrative of an alignment of the eight measuring patterns P1 basically the same pattern as shown in FIG. 2, provided that the eight measuring patterns P1 are different in pitch of the first to seventh straight line segments L1, L2, L3, L4, L5, L6 and L7 of the second straight line part L2 thereof. Each of the first to eighth measuring patterns P1 comprises four pairs of a first straight line part PL1 and a second straight line part PL2, wherein first and second pairs of the first and second straight line parts PL1 and PL2 are directed in the X-direction and distanced from each other by a predetermined distance, and the remaining third and fourth pairs of the first and second straight line parts PL1 and PL2 are directed in the Y-direction perpendicular to the X-direction and distanced from each other by the same distance. The first and second pairs of the first and second straight line parts PL1 and PL2 are placed along first opposite sides of a square, whilst the third and fourth pairs of the first and second straight line parts PL1 and PL2 are placed along second opposite sides of the square. Each of the measuring patterns P1 has a shape of square which comprises four sides, wherein each of the four sides comprises a single pair of the first and second straight line parts PL1 and PL2, provided that the first straight line part PL1 is positioned outside of the second straight line part PL2, Namely, the second straight line part PL2 is positioned inside of the first straight line part PL1. The paired first and second straight line parts PL1 and PL2 are also extend in the same direction but are distanced from each other at a predetermined short distance. Thus, the four first straight line parts PL1 form an outer square, whilst the four second straight line parts PL2 form an inner square surrounded by the outer square, Each of the four first straight line parts PL1 comprises a single broader straight line segment having a width of 3 micrometers. Each of the four second straight line parts PL2 comprises plural straight line segments different in width, for example, first to seventh straight line segments L1 to L7 having first to seventh widths which are different from each other. The plural straight line segments, for example, first to seventh straight line segments L1 to L7 have a uniform longitudinal direction. The plural straight line segments, for example, first to seventh straight line segments L1 to L7 are aligned in a direction perpendicular to the uniform longitudinal direction at a constant pitch Pt. The first straight line segment L1 of the second straight line part PL2 has a first width which is narrowest in all of the straight line segments of the second straight line part PL2. The second straight line segment L2 of the second straight line part PL2 has a second width which is second narrower to the first width of the first straight line segment L1. The third straight line segment L3 of the second straight line part PL2 has a third width which is third narrower to the second width of the second straight line segment L2. The second width of the second straight line segment L2 is narrower than the third width of the third straight line segment L3 and wider than the first width of the first straight line segment L1. The fourth straight line segment L4 of the second straight line part PL2 has a fourth width which is fourth narrower to the third width of the third straight line segment L3. The third width of the third straight line segment L3 is narrower than the fourth width of the fourth straight line segment L4 and wider than the second width of the second straight line segment L2. The fifth straight line segment L5 of the second straight line part PL2 has a fifth width which is fifth narrower to the fourth width of the fourth straight line segment L4 and namely the fifth width is third wider. The fourth width of the fourth straight line segment L4 is narrower than the fifth width of the fifth straight line segment L5 and wider than the third width of the third straight line segment L3. The sixth straight line segment L6 of the second straight line part PL2 has a sixth width which is sixth narrower to the fifth width of the fifth straight line segment L5 and namely the sixth width is second wider. The fifth width of the fifth straight line segment L5 is narrower than the sixth width of the sixth straight line segment L6 and wider than the fourth width of the fourth straight line segment L4. The seventh straight line segment L7 of the second straight line part PL2 has a seventh width which is seventh narrower to the sixth width of the sixth straight line segment L6 and namely the seventh width is the widest in all of the straight line segments of the second straight line part PL2. The sixth width of the sixth straight line segment L6 is narrower than the seventh width of the seventh straight line segment L7 and wider than the fifth width of the fifth straight line segment L5. Accordingly, the first to seventh straight line segments L1, L2, L3, L4, L5, L6 and L7 are aligned in the order of the width thereof from the narrowest width to the widest width, however, at the corresponding pitch Pt and at various gaps between adjacent ones of the first to seventh straight line segments L1, L2, L3, L4, L5, L6 and L7. The first measuring pattern has the first pitch P11 of 300 nanometers for alignment of the first to seventh straight line segments L1, L2, L3, L4, L5, L6 and L7 of the second straight line part L2 The second measuring pattern has the second pitch P12 of 350 nanometers for alignment of the first to seventh straight line segments L1, L2, L3, L4, 15, L6 and L7 of the second straight line part L2. The third measuring pattern has the third pitch P13 of 400 nanometers for alignment of the first to seventh straight line segments L1, L2, 13, L4, L5, L6 and L7 of the second straight line part L2. The fourth measuring pattern has the fourth pitch P14 of 500 nanometers for alignment of the first to seventh straight line segments L1, L2, L3, L4, L5, L6 and L7 of the second straight line part L2. The fifth measuring pattern has the fifth pitch P15 of 600 nanometers for alignment of the first to seventh straight line segments L1, L2, L3, L4, L5, L6 and L7 of the second straight line part L2. The sixth measuring pattern has the sixth pitch P16 of 700 nanometers for alignment of the first to seventh straight line segments L1, L2, L3, L4, L5, L6 and L7 of the second straight line part L2. The seventh measuring pattern has the seventh pitch P17 of 800 nanometers for alignment of the first to seventh straight line segments L1, L2, L3, L4, L5, L6 and L7 of the second straight line part L2. The eighth measuring pattern has the eighth pitch P18 of 900 nanometers for alignment of the first to seventh straight line segments L1, L2, L3, L4, 15, L6 and L7 of the second straight line part L2.

Figure 11:
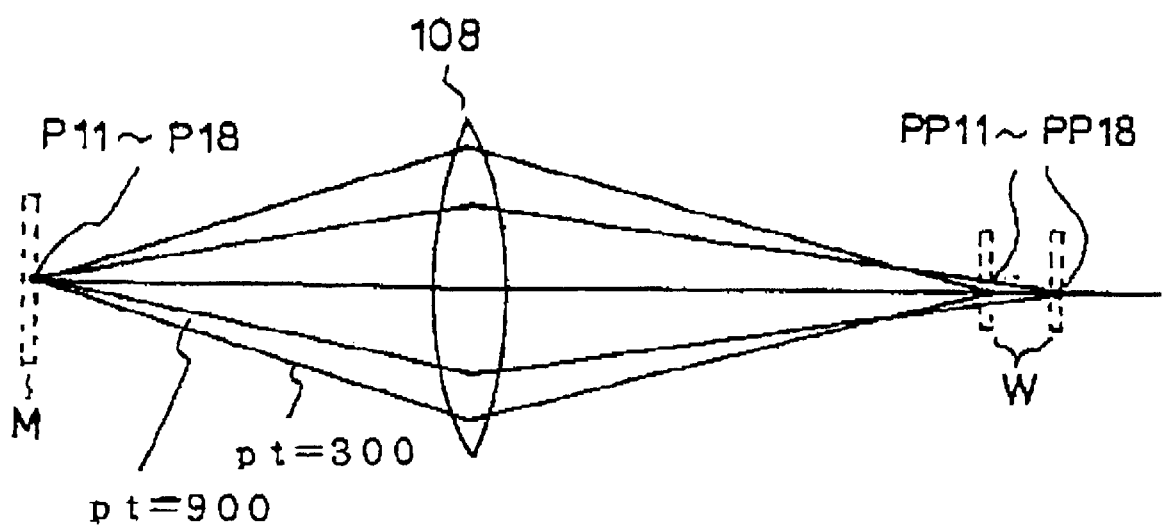
FIG. 11 is a schematic view illustrative of the exposing light beam, wherein the light beam passed through the measuring mask M and transmitted through the projection optical system and irradiated onto the surface of the measuring wafer W.

The above measuring mask M having the plural measuring patterns P1 differing in the pitch for alignments of the first to seventh straight line segments L1, L2, L3, L4, L5, L6 and L7 of the second straight line part L2 is used for the exposure process and subsequent development process to form the photo-resist patterns over the surface of the measuring wafer W. When the luminance light passes through the measuring mask M, a diffraction appears on the luminance light. The angle of the diffraction depends on the pitch of the for alignments of the first to seventh straight line segments L1, L2, L3, L4, L5, L6 and L7 of the second straight line part L2 of the plural measuring patterns P1 of the measuring mask M. The angle of the diffraction is different depending upon the different pitches of the eight measuring patterns P1 of the measuring mask M. FIG. 11 is a schematic view illustrative of the exposing light beam, wherein the light beam passed through the measuring mask M and transmitted through the projection optical system and irradiated onto the surface of the measuring wafer W. If the pitch is small, then the angle of the diffraction is large. If the pitch is large, then the angle of the diffraction is small. If the exposing light beam passes through the first measuring pattern P1 having the first pitch P11 which is narrowest, for example, 300 nanometers, then the angle of the diffraction is largest and the first photo-resist pattern PP11 is formed over the measuring wafer W. If the exposing light beam passes through the second measuring pattern P1 having the second pitch P12 which is second narrower, for example, 350 nanometers, then the angle of the diffraction is second larger and the second photo-resist pattern PP12 is formed over the measuring wafer W. If the exposing light beam passes through the third measuring pattern P1 having the third pitch P13 which is third narrower, for example, 400 nanometers, then the angle of the diffraction is third larger and the third photo-resist pattern PP13 is formed over the measuring wafer W. If the exposing light beam passes through the fourth measuring pattern P1 having the fourth pitch P14 which is fourth narrower, for example, 500 nanometers, then the angle of the diffraction is fourth larger and the fourth photo-resist pattern PP14 is formed over the measuring wafer W. If the exposing light beam passes through the fifth measuring pattern P1 having the fifth pitch P15 which is fifth narrower, for example, 600 nanometers, then the angle of the diffraction is fifth larger and the fifth photo-resist pattern PP15 is formed over the measuring wafer W. If the exposing light beam passes through the sixth measuring pattern P1 having the sixth pitch P16 which is sixth narrower, for example, 700 nanometers, then the angle of the diffraction is sixth larger and the sixth photo-resist pattern PP16 is formed over the measuring wafer W. If the exposing light beam passes through the seventh measuring pattern P1 having the seventh pitch P17 which is second wider, for example, 800 nanometers, then the angle of the diffraction is second smaller and the seventh photo-resist pattern PP17 is formed over the measuring wafer W. If the exposing light beam passes through the eighth measuring pattern P1 having the eighth pitch P18 which is widest, for example, 900 nanometers, then the angle of the diffraction is smallest and the eighth photo-resist pattern PP18 is formed over the measuring wafer W. The first photo-resist pattern PP11 corresponds to the first measuring pattern P1 having the first pitch P11 The second photo-resist pattern PP12 corresponds to the second measuring pattern P1 having the second pitch P12. The third photo-resist pattern PP13 corresponds to the third measuring pattern P1 having the third pitch P13. The fourth photo-resist pattern PP14 corresponds to the fourth measuring pattern P1 having the fourth pitch P14. The fifth photo-resist pattern PP15 corresponds to the fifth measuring pattern P1 having the fifth pitch P15. The sixth photo-resist pattern PP16 corresponds to the sixth measuring pattern P1 having the sixth pitch P16. The seventh photo-resist pattern PP17 corresponds to the seventh measuring pattern P1 having the seventh pitch P17. The eighth photo-resist pattern PP18 corresponds to the eighth measuring pattern P1 having the eighth pitch P18. The measuring wafer W having the above first to eighth photo-resist patterns PP11, PP12, PP13, PP14, PP15, PP16, PP17 and PP18 is then placed in the pattern recognition apparatus, The pattern recognition apparatus irradiates an optical beam onto the first to eighth photo-resist patterns PP11, PP12, PP13, PP14, PP15, PP16, PP17 and PP18 with scanning operation in the X-direction over the measuring wafer W. The irradiated light onto the first to eighth photo-resist patterns PP11, PP12, PP13, PP14, PP15, PP16, PP17 and PP18 is reduced in intensity, The reflected light from the first to eighth photo-resist patterns PP11, PP12, PP13, PP14, PP15, PP16, PP17 and PP18 is lower in intensity than the reflected light from the surface of the measuring wafer W. The pattern recognition apparatus detects the intensity or the quantity of photon of the reflected light to measure the width or size of each of the first to eighth photo-resist patterns PP11, PP12, PP13, PP14, PP15, PP16, PP17 and PP18 in the direction along which the light beam is scanned by the pattern recognition apparatus. As a result of the integration of the measured data, the pattern recognition is made. First type photo-resist pattern center positions C11 and C12 in the X-direction of the first type photo-resist patterns PP1 and PP1 can be calculated from the low level timing of the detected signal S in the scanning operation in the X-direction. Second type photo-resist pattern center positions C21 and C22 in the X-direction of the second type photo-resist patterns PP2 and PP2 can also be calculated from the low level timing of the detected signal S in the scanning operation in the X-direction. A first center position C1 between the calculated first type photo-resist pattern center positions C11 and C12 in the X-direction of the first type photo-resist patterns PP1 is further calculated from the calculated first type photo-resist pattern center positions C11 and C12. A second center position C2 between the calculated second type photo-resist pattern center positions C21 and C22 in the X-direction of the second type photo-resist patterns PP2 is further calculated from the calculated second type photo-resist pattern center positions C21 and C22. If the exposure was made in the remarkable defocus state, then the first and second center positions C1 and C2 are different from each other in the X-direction. Namely, the exposure was made in the remarkable defocus state, then the first type photo-resist pattern PP1 is free of any deformation or any certain distortion in shape from the first type photo-resist pattern PP1, but the second type photo-resist pattern PP2 includes a certain deformation or a certain distortion in shape from the straight line segments of the second straight line part P2. Particularly, the slender straight line segments of the second straight line part PL2, for example, the first and second straight line segments L1 and L2 of the second straight line part PL2 are likely to cause dispersion of the exposing light beam due in the remarkable defocus state, whereby the intensity of the exposing light beam to the photo-resist film is reduced. As a reduction in the intensity of the exposing light beam, it is possible that the narrow-width straight line segments of the second straight line part PL2 are not projected onto the photo-resist film and the narrow-width straight line segment photo-resist patterns are not formed over the measuring wafer W, even the remaining wider straight line segment photo-resist patterns are formed over the measuring wafer W. Since the narrow-width straight line segment photo-resist patterns L1 and L2 are not formed, then the second type photo-resist pattern PP2 comprises the wider straight line segment photo-resist patterns and is free of the narrow-width straight line segment photo-resist patterns. The width of the second type photo-resist pattern PP2 is thus defined between the outer edge of the narrowest straight line segment photo-resist pattern and the outer edge of the widest straight line segment photo-resist pattern. Further, the extent in the X-direction of the second type photo-resist pattern PP2 is defined by the outer edge position of the narrowest straight line segment photo-resist pattern and the outer edge position of the widest straight line segment photo-resist pattern. Namely, since the second type photo-resist pattern PP2 is exclusive of the narrow-width straight line segment photo-resist patterns, the extent in the X-direction of the second type photo-resist pattern PP2 is different from what is obtained in the best focus state. Thus, the calculated second center position C2 is displaced and different from the position calculated in the case of the best focus state, For this reason, if the exposure was made in the remarkable defocus state, then the first and second center positions C1 and C2 are different from each other by a large displacement "dx" in the X-direction.

As described above, it can be understood that the displacement "dx" between the first and second center positions C1 and C2 of the first and second type photo-resist patterns PP1 and PP2 depends on the magnitude of the defocus. If the exposure was made in the best focus, then the displacement "dx" is zero. Namely, if the displacement "dx" is zero, then this means that the exposure was made in the best focus. If the displacement "dx" is not zero, then this means that the exposure was made in the defocus. The displacement "dx" depends on the magnitude of the defocus. If the exposure was made at the best focus position of the measuring wafer W in the Z-direction, then the displacement "dx" is zero. If the exposure was made at a position displaced toward the projection optical system 109 from the best focus position of the measuring wafer W in the Z-direction, then the displacement "dx" is not zero. If the exposure was made at a position displaced in an opposite direction to the projection optical system 109 from the best focus position of the measuring wafer W in the Z-direction, then the displacement "dx" is also not zero. The displacement "dx" is increased by displacing the measuring wafer W in the Z-direction from the best focus position.

Figure 12:
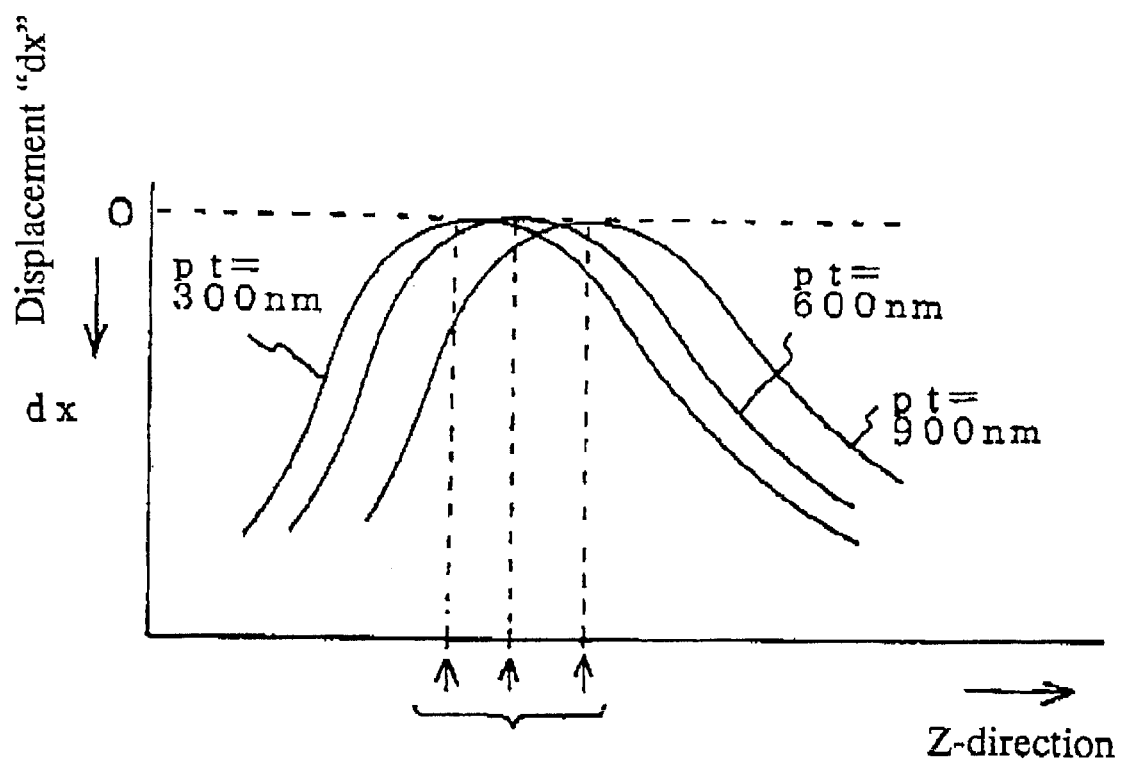
FIG. 12 is a diagram illustrative of variations in the displacement "dx" defined between the first and second center positions C1 and C2 of the first and second type photo-resist patterns PP1 and PP2 in the X-direction over the position of the measuring wafer W in the Z-direction with reference to the first best focus position in the Z-direction for the X-direction scanning.

FIG. 12 is a diagram illustrative of variations in the displacement "dx" defined between the first and second center positions C1 and C2 of the first and second type photo-resist patterns PP1 and PP2 in the X-direction over the position of the measuring wafer W in the Z-direction with reference to the first best focus position in the Z-direction for the X-direction scanning. The best focus position in the Z-direction for the X-direction scanning depends on the individual different pitches for alignments of the plural straight line segments of the second straight line part L2 of the measuring patterns P1 having the different first to eighth pitches P11, P12, P13, P14, P15, P16, P17 and P18. For each of the first to eighth pitches P11, P12, P13, P14, P15, P16, P17 and P18 of the measuring patterns P1, the first best focus position in the Z-direction for the X-direction scanning is obtained as follows. The light beam LB is scanned in the X-direction by the pattern recognition apparatus over the measuring wafer W for obtaining the detected signal S to calculate the first and second center positions C1 and C2 in the X-direction of the first and second type photo-resist patterns PP1 and PP2. The first displacement "dx" defined to be a difference between the first and second center positions C1 and C2 in the X-direction of the first and second type photo-resist patterns PP1 and PP2 is thus calculated in each of various cases varying the positions of the measuring wafer W in the Z-direction. The calculated values of the first displacement "dx" are then plotted in the vertical axis of the graph whilst the corresponding positions of the measuring wafer W in the Z-direction are then plotted in the horizontal axis of the graph. The peak point of the curve of the calculated values of the first displacement "dx" means the displacement free position or the first best focus position in the Z-direction for the X-direction scanning. Even illustration is omitted from FIG. 12, For each of the first to eighth pitches P11, P12, P13, P14, P15, P16, P17 and P18 of the measuring patterns P1, the second best focus position in the Z-direction for the Y-direction scanning is also obtained as follows. The light beam LB is scanned in the Y-direction by the pattern recognition apparatus over the measuring wafer W for obtaining the detected signal S to calculate the first and second center positions C1 and C2 in the Y-direction of the first and second type photo-resist patterns PP1 and PP2. The second displacement "dy" defined to be a difference between the first and second center positions C1 and C2 in the Y-direction of the first and second type photo-resist patterns PP1 and PP2 is thus calculated in each of various cases varying the positions of the measuring wafer W in the Z-direction. The calculated values of the second displacement "dy" are then plotted in the vertical axis of the graph whilst the corresponding positions of the measuring wafer W in the Z-direction are then plotted in the horizontal axis of the graph. The peak point of the curve of the calculated values of the second displacement "dy" means the displacement free position or the second best focus position in the Z-direction for the Y-direction scanning.

The variation curve of the displacement "dx" depends on the pitch for the alignment of the straight line segments of the second straight line part L2 of the measuring pattern P1 of the measuring mask M. FIG. 12 illustrates only the three variation curves of the displacement "dx" in cases of the different three pitches, for example, 300 nanometers, 600 nanometers, and 900 nanometers. The three variation curves of the displacement "dx" in cases of the different three pitches, for example, 300 nanometers, 600 nanometers, and 900 nanometers have different three peaks which correspond to the individual best focus positions. Namely, the in cases of the different three pitches, for example, 300 nanometers, 600 nanometers, and 900 nanometers, the best focus positions are different. The best focus positions are found for all of the first to eighth measuring patterns P1 having the first to eighth pitches P11, P12, P13, P14, P15, P16, P17 and P18. Further, the best focus positions are similarly found for the Y-direction. The spherical aberration is obtained from all of the best focus positions for all of the first to eighth measuring patterns P1 having the first to eighth pitches P11, P12, P13, P14, P15, P16, P17 and P18 and for the X-direction and the Y-direction.

Accordingly, the best focus and the defocus of the measuring pattern P1 can automatically be detected from the detection of the signal variation by the pattern recognition apparatus without any manual operation using the microscopes. The novel measuring mask M and the novel measuring method are free from the above described problems engaged with the above described prior art.

Second Embodiment

Figure 13:
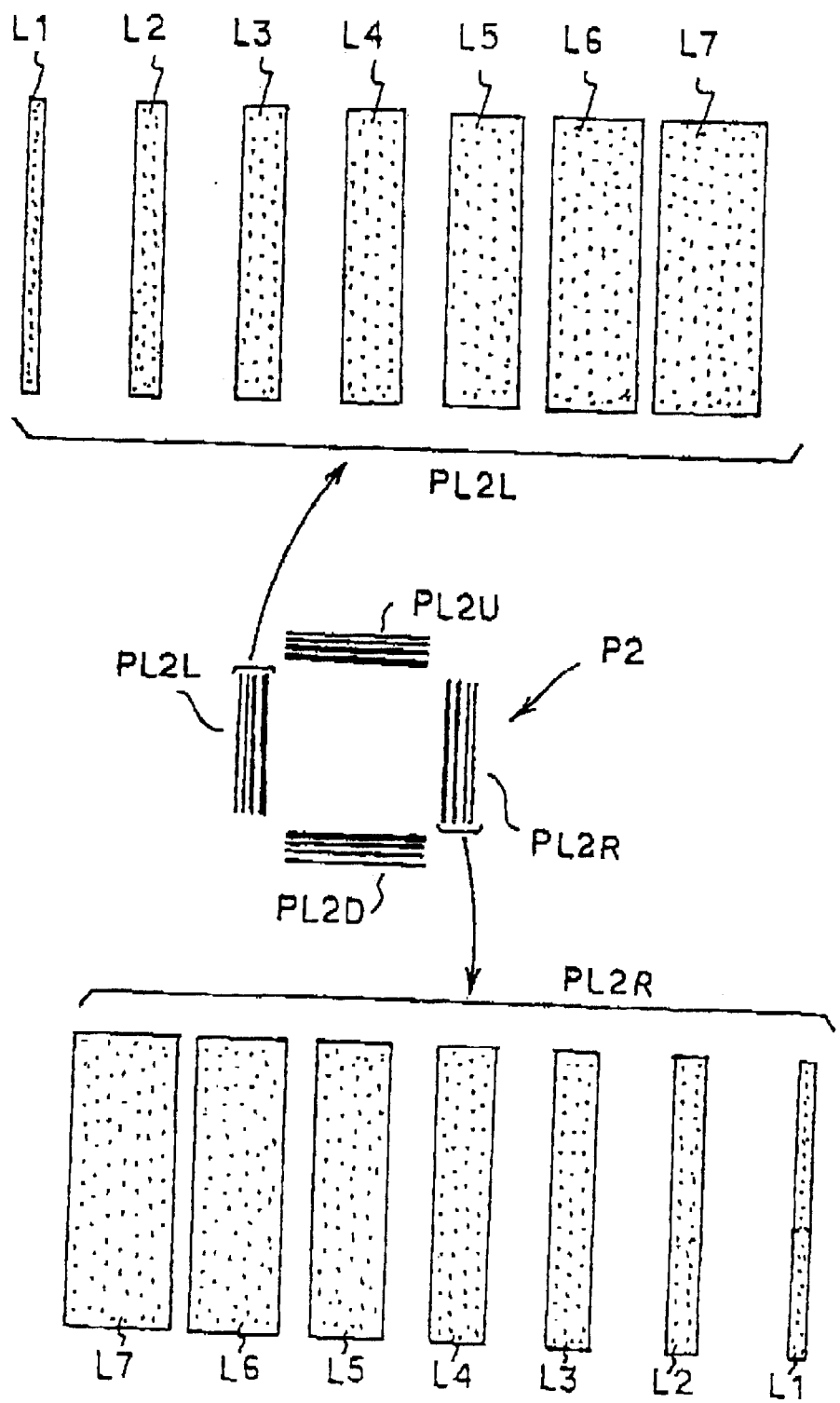
FIG. 13 is a view illustrative of one of plural measuring patterns of a second novel measuring mask M, and also illustrative with enlargement of the second straight line parts in accordance with the present invention.

A second embodiment according to the present invention will be described in detail with reference to the drawings. FIG. 13 is a view illustrative of one of plural measuring patterns of a second novel measuring mask M, and also illustrative with enlargement of the second straight line parts in accordance with the present invention. The novel measuring mask M has a uniform distribution of plural measuring patterns P2. The uniform distribution of the plural measuring patterns P2 may, for example, comprise a matrix array of nine measuring patterns P2. Each of the measuring patterns P2 may comprise a metal foil pattern of a light-shielding metal such as chromium over the surface of the body of the measuring mask M. Each of the measuring patterns P2 further comprises four second straight line parts PL2U, PL2D, PL2L, and PL2R, wherein the second straight line parts PL2U and PL2D are directed in the X-direction and distanced from each other by a predetermined distance in the Y-direction, and the remaining second straight line parts PL2L and PL2R are directed in the Y-direction perpendicular to the X-direction and distanced from each other by the same distance in the X-direction. The second straight line parts PL2U and PL2D are placed along first opposite sides of a square, whilst the third and fourth pairs of the first and second straight line parts PL2L and PL2R are placed along second opposite sides of the square. Each of the measuring patterns P2 has a shape of square which comprises four sides which comprise the four second straight line parts PL2U, PL2D, PL2L, and PL2R. Each of the four second straight line parts PL2U, PL2D, PL2L, and PL2R comprises plural straight line segments different in width, for example, first to seventh straight line segments L1 to L7 having first to seventh widths which are different from each other. The plural straight line segments, for example, first to seventh straight line segments L1 to L7 have a uniform longitudinal direction The plural straight line segments, for example, first to seventh straight line segments L1 to L7 are aligned in a direction perpendicular to the uniform longitudinal direction at a constant pitch Pt. The first straight line segment L1 of each of the second straight line parts PL2U, PL2D, PL2L, and PL2R has a first width which is narrowest in all of the straight line segments of the second straight line part PL2. The second straight line segment L2 of each of the second straight line parts PL2U, PL2D, PL2L, and PL2R has a second width which is second narrower to the first width of the first straight line segment L1. The third straight line segment L3 of each of the second straight line parts PL2U, PL2D, PL2L, and PL2R has a third width which is third narrower to the second width of the second straight line segment L2. The second width of the second straight line segment L2 is narrower than the third width of the third straight line segment 13 and wider than the first width of the first straight line segment L1. The fourth straight line segment L4 of each of the second straight line parts PL2U, PL2D, PL2L, and PL2R has a fourth width which is fourth narrower to the third width of the third straight line segment L3. The third width of the third straight line segment L3 is narrower than the fourth width of the fourth straight line segment L4 and wider than the second width of the second straight line segment L2. The fifth straight line segment L5 of each of the second straight line parts PL2U, PL2D, PL2L, and PL2R has a fifth width which is fifth narrower to the fourth width of the fourth straight line segment L4 and namely the fifth width is third wider. The fourth width of the fourth straight line segment L4 is narrower than the fifth width of the fifth straight line segment L5 and wider than the third width of the third straight line segment L3. The sixth straight line segment L6 of each of the second straight line parts PL2U, PL2D, PL2L, and PL2R has a sixth width which is sixth narrower to the fifth width of the fifth straight line segment L5 and namely the sixth width is second wider. The fifth width of the fifth straight line segment L5 is narrower than the sixth width of the sixth straight line segment L6 and wider than the fourth width of the fourth straight line segment L4. The seventh straight line segment L7 of each of the second straight line parts PL2U, PL2D, PL2L, and PL2R has a seventh width which is seventh narrower to the sixth width of the sixth straight line segment L6 and namely the seventh width is the widest in all of the straight line segments of the second straight line part PL2. The sixth width of the sixth straight line segment L6 is narrower than the seventh width of the seventh straight line segment L7 and wider than the fifth width of the fifth straight line segment L5. Accordingly, the first to seventh straight line segments L1, L2, L3, L4, L5, L6 and L7 are aligned in the order of the width thereof from the narrowest width to the widest width, however, at the constant pitch Pt and at various gaps between adjacent ones of the first to seventh straight line segments L1, L2, L3, L4, L5, L6 and L7. The widths of the seven straight line segments vary to increase in the direction from the first straight line segment L1 to the seventh straight line segment L7, whilst the gaps between the seven straight line segments vary to decrease in the direction from the first straight line segment L1 to the seventh straight line segment L7, provided that the alignment pitch of the seven straight line segments remains unchanged. The second straight line parts PL2U and PL2D, each of which comprises the plural straight line segments having the first longitudinal direction parallel to the X-direction, have the opposite alignment directions to each other, wherein the seventh straight line segments of the second straight line parts PL2U and PL2D are positioned most inside, and the first in the straight line segments of the second straight line parts PL2U and PL2D are positioned most outside. The second straight line parts PL2L and PL2R, each of which comprises the plural straight line segments having the second longitudinal direction parallel to the Y-direction, also have the opposite alignment directions to each other, wherein the seventh straight line segments of the second straight line parts PL2L and PL2R are positioned most inside, and the first in the straight line segments of the second straight line parts PL2L and PL2R are positioned most outside. The rate of increase in width from the first straight line segment L1 to the seventh straight line segment L7 of each of the four second straight line parts PL2U, PL2D, PL2L and PL2R may be constant. For example, the first width of the first straight line segment L1 of each of the four second straight line parts PL2U, PL2D, PL2L and PL2R may, for example, be 0.1 micrometers. The second width of the second straight line segment L2 of each of the four second straight line parts PL2U, PL2D, PL2L and PL2R may, for example, be 0.15 micrometers. The third width of the third straight line segment L7 of each of the four second straight line parts PL2U, PL2D, PL2L and PL2R may, for example, be 0.2 micrometers. The fourth width of the fourth straight line segment L4 of each of the four second straight line parts PL2U, PL2D, PL2L and PL2R may, for example, be 0.25 micrometers. The fifth width of the fifth straight line segment L5 of each of the four second straight line parts PL2U, PL2D, PL2L and PL2R may, for example, be 0.3 micrometers. The sixth width of the sixth straight line segment L6 of each of the four second straight line parts PL2U, PL2D, PL2L and PL2R may, for example, be 0.35 micrometers. The seventh width of the seventh straight line segment L7 of each of the four second straight line parts PL2U, PL2D, PL2L and PL2R may, for example, be 0.4 micrometers. The constant pitch may be set at 0.5 micrometers.

As described above, the novel measuring mask M has the uniform distribution of the plural measuring patterns P2. The uniform distribution of the plural measuring patterns P2 may, for example, comprise the matrix array of the nine measuring patterns P2. It is, of course, possible as a modification that the uniform distribution of the plural measuring patterns P2 may comprise a concentrically circulated distribution having a center corresponding to the optical axis of the above target projection optical system 109. It is further possible as a modification that the uniform distribution of the plural measuring patterns P2 may comprise a radial distribution from a center corresponding to the optical axis of the above target projection optical system 109. Namely, it is possible as a modification that the uniform distribution of the plural measuring patterns P2 may comprise a distribution symmetrical with the optical axis of the above target projection optical system 109.

A method of measuring the even function aberration by use of the above described novel measuring mask M will subsequently be described. The novel measuring mask M is placed on the mask stage 107 of the projection exposure system 100. The photo-resist applied measuring wafer W having the surface applied with the photo-resist film is also placed on the wafer stage 109. The light is illuminated through the lighting optical system 106 onto the measuring mask M having the measuring pattern P1, so that the light having the measuring pattern P1 is further transmitted through the reducing projection optical system 109 and focused onto the photo-resist film over the measuring wafer W, whereby the photo-resist film over the measuring wafer W is exposed to the focused light with the size-reduced measuring pattern. During this exposure process, the wafer stage 109 is placed under the two-dimensional movements both in the X-direction and in the Y-direction, so that the exposing position over the photo-resist film over the measuring wafer W is moved in the X-direction and the Y-direction. Further, during this exposure process, the wafer stage 109 is varied in the Z-direction parallel to the optical axis of the projection optical system 109 by a fine scale unit in a small range including a presumed best focus position. The fine scale unit may, for example, be 0.1 micrometer. The small range may, for example, be −1.0 micrometer to +1.0 micrometer. The exposures are made plural times to form plural exposed parts of the photo-resist film over the measuring wafer W.

Subsequent to the exposure process, a development of the exposed photo-resist film is made to form plural photo-resist patterns PP which correspond to the size-reduced measuring patterns P1 of the measuring mask M with various focus positions As a result, there is formed alignments of the plural photo-resist patterns PP in a direction perpendicular to the orientation flat "OF" of the measuring wafer W, wherein each alignment comprises the plural photo-resist patterns PP which are different in focus position in the Z-direction, namely different in the Z-directional position of the measuring wafer W over the wafer stage 109 under the fine movement in the Z-direction. The measuring wafer W having the photo-resist patterns PP is then placed in a pattern recognition apparatus which is not illustrated for measurement to the photo-resist patterns PP. The pattern recognition apparatus irradiates an optical beam onto the photo-resist patterns PP with scanning operation over the measuring wafer W. The irradiated light onto the photo-resist patterns PP is reduced in intensity. The reflected light from the photo-resist patterns PP is lower in intensity than the reflected light from the surface of the measuring wafer W. The pattern recognition apparatus detects the intensity or the quantity of photon of the reflected light to measure the width or size of the each photo-resist pattern PP in the direction along which the light beam is scanned by the pattern recognition apparatus. As a result of the integration of the measured data, the pattern recognition is made.

Figure 14:
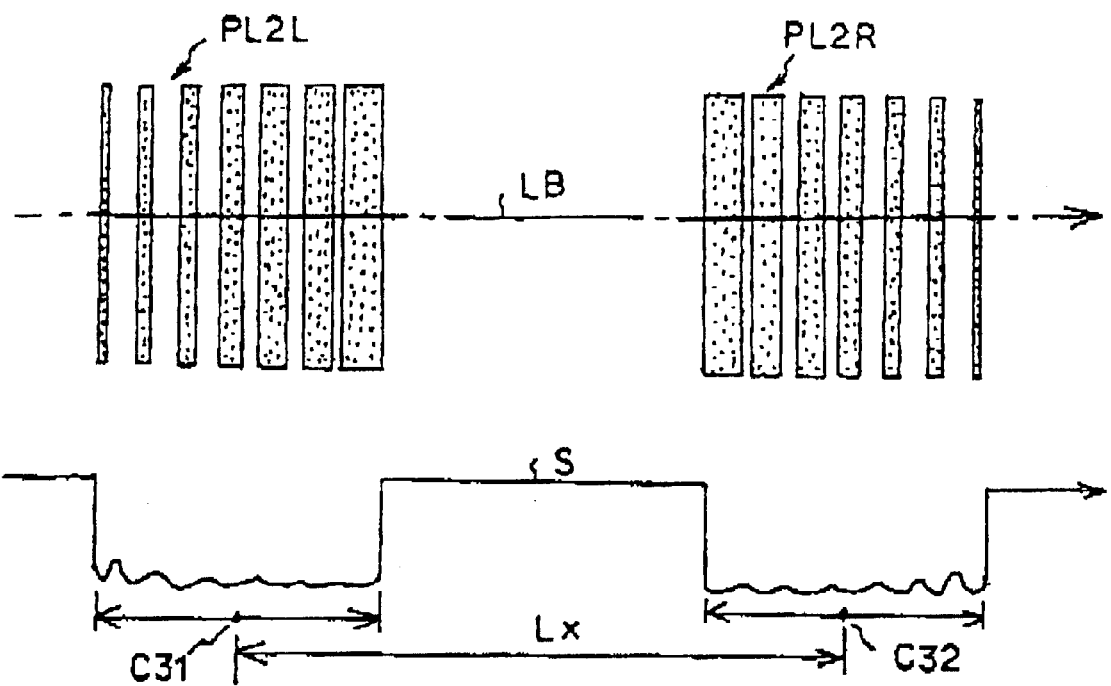
FIG. 14 is a fragmentary view illustrative of the result of the measurement to the pattern recognition of the photo-resist patterns PP over the measuring wafer W by use of the pattern recognition apparatus with the best focus.

FIG. 14 is a fragmentary view illustrative of the result of the measurement to the pattern recognition of the photo-resist patterns PP over the measuring wafer W by use of the pattern recognition apparatus with the best focus The pattern recognition apparatus irradiates the light beam LB onto the surface of the measuring wafer W, wherein the light beam LB is scanned in the X-direction across over the second type photo-resist patterns PL2L and PL2R, each of which comprises the first to seventh straight line segment photo-resist patterns L1, L2, L3, L4, L5, L6 and L7. The light beam LB is reflected from the surface of the measuring wafer W and the reflected light is received by the pattern recognition apparatus, and the reflected light beam LB is detected as a signal S by the pattern recognition apparatus. A first type reflected light reflected from the second type photo-resist patterns PL2L and PL2R is lower in intensity than a second type reflected light reflected from the surface of the measuring wafer W. Namely, when the light beam LB on scanning operation in the X-direction is irradiated onto the second type photo-resist patterns PL2L and PL2R, then the detected signal S is low level. If the light beam LB on scanning operation in the X-direction is irradiated onto the surface of the measuring wafer W, then the detected signal S is high level. If the exposure was made in the best focus state, then the second type photo-resist patterns PL2L and PL2R are free of any deformation or any distortion in shape from the straight line segments of the second straight line parts PL2L and PL2R. Each of the second type photo-resist patterns PL2L and PL2R comprises the first to seventh photo-resist pattern straight line segments L1, L2, L3, L4, L5, L6 and L7. A first photo-resist pattern center position C31 in the X-direction of the second type photo-resist pattern P12R can be calculated from the low level timing of the detected signal S in the scanning operation in the X-direction across the second type photo-resist pattern P12L. A second photo-resist pattern center position C32 in the X-direction of the second type photo-resist pattern P12R can be calculated from the low level timing of the detected signal S in the scanning operation in the X-direction across the second type photo-resist pattern P12R. Further, a distance Lx in the X-direction between the first and second photo-resist pattern center positions C31 and C32 is calculated. If the exposure was realized in the best focus state, then the distance Lx in the X-direction between the first and second photo-resist pattern center positions C31 and C32 is maximum. Namely, the exposure was realized in the best focus state, then the second type photo-resist patterns PL2L and PL2R are free of any deformation or distortion in shape from the second straight line parts PL2. For this reason, if the exposure was realized in the best focus state, then the distance Lx in the X-direction between the first and second photo-resist pattern center positions C31 and C32 is maximum.

Figure 15:
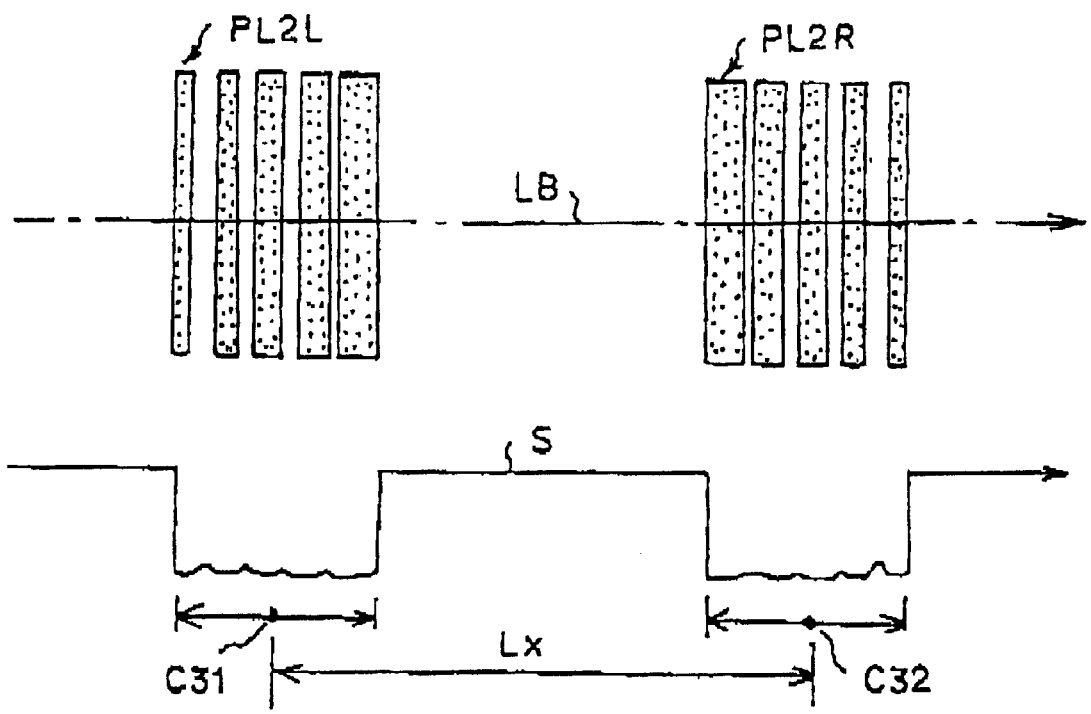
FIG. 15 is a fragmentary view illustrative of the result of the measurement to the pattern recognition of the photo-resist patterns PP over the measuring wafer W by use of the pattern recognition apparatus with the defocus.

FIG. 15 is a fragmentary view illustrative of the result of the measurement to the pattern recognition of the photo-resist patterns PP over the measuring wafer W by use of the pattern recognition apparatus with the defocus. The pattern recognition apparatus irradiates the light beam LB onto the surface of the measuring wafer W, wherein the light beam LB is scanned in the X-direction across over the second type photo-resist patterns PL2L and PL2R, each of which comprises the first to seventh straight line segment photo-resist patterns L1, L2, L3, L4, L5, L6 and L7. The light beam LB is reflected from the surface of the measuring wafer W and the reflected light is received by the pattern recognition apparatus, and the reflected light beam LB is detected as a signal S by the pattern recognition apparatus. A first type reflected light reflected from the second type photo-resist patterns PL2L and PL2R is lower in intensity than a second type reflected light reflected from the surface of the measuring wafer W. Namely, when the light beam LB on scanning operation in the X-direction is irradiated onto the second type photo-resist patterns PL2L and PL2R, then the detected signal S is low level. If the light beam LB on scanning operation in the X-direction is irradiated onto the surface of the measuring wafer W, then the detected signal S is high level. A first photo-resist pattern center position C31 in the X-direction of the second type photo-resist pattern P12L can be calculated from the low level timing of the detected signal S in the scanning operation in the X-direction across the second type photo-resist pattern P12L. A second photo-resist pattern center position C32 in the X-direction of the second type photo-resist pattern P12R can be calculated from the low level timing of the detected signal S in the scanning operation in the X-direction across the second type photo-resist pattern P12R. Further, a distance Lx in the X-direction between the first and second photo-resist pattern center positions C31 and C32 is calculated. Namely, the exposure was made in the remarkable defocus state, then the second type photo-resist patterns PL2L and PL2R include a certain deformation or a certain distortion in shape from the straight line segments of the second straight line parts PL2L and PL2R. Particularly, the slender straight line segments of the second straight line part PL2L and PL2R, for example, the first and second straight line segments L1 and L2 of the second straight line parts PL2L and PL2R are likely to cause dispersion of the exposing light beam due in the remarkable defocus state, whereby the intensity of the exposing light beam to the photo-resist film is reduced. As a reduction in the intensity of the exposing light beam, it is possible that the first and second straight line segments L1 and L2 of the second straight line parts PL2L and PL2R are not projected onto the photo-resist film and the first and second straight line segment photo-resist patterns L1 and L2 are not formed over the measuring wafer W, even the remaining third to seventh straight line segment photo-resist patterns L3, L4, L5, L6 and L7 are formed over the measuring wafers W. Since the first and second straight line segment photo-resist patterns L1 and L2 are not formed, then the second type photo-resist patterns PL2L and PL2R comprises the third to seventh straight line segment photo-resist patterns L3, L4, L5, L6 and L7 and is free of the first and second straight line segment photo-resist patterns L1 and L2. The width of the second type photo-resist pattern PP2 is thus defined between the outer edge of the third straight line segment photo-resist pattern L3 and the outer edge of the seventh straight line segment photo-resist pattern L7. Further, the extent in the X-direction of the second type photo-resist pattern PP2 is defined by the outer edge position of the third straight line segment photo-resist pattern L3 and the outer edge position of the seventh straight line segment photo-resist pattern L7. Namely, since the second type photo-resist pattern PP2 is exclusive of the first and second straight line segment photo-resist patterns L1 and L2, the extent in the X-direction of the second type photo-resist pattern PP2 is largely different from what is obtained in the best focus state. Thus, the calculated second center position C2 is largely displaced and different from the position calculated in the case of the best focus state. For this reason, if the exposure was made in the remarkable defocus state, then the first and second center positions C1 and a are largely different from each other by a large displacement "dx" in the X-direction. If the exposure was realized in the defocus state then the distance Lx in the X-direction between the first and second photo-resist pattern center positions C31 and C32 is shorter than what is obtained in the best focus state. Namely, the exposure was realized in the defocus state, then the second type photo-resist patterns PL2L and PL2R includes a certain deformation or a distortion in shape from the second straight line parts PL2. For this reason, if the exposure was realized in the defocus state, then the distance Lx in the X-direction between the first and second photo-resist pattern center positions C31 and C32 is shorter than what is obtained in the best focus state.

The decrement of the distance Lx in the X-direction between the first and second photo-resist pattern center positions C31 and C32 depends on the magnitude of the defocus. If the exposure was made in the best focus state, then the distance Lx in the X-direction between the first and second photo-resist pattern center positions C31 and C32 is maximum. If the exposure was made in the defocus state, then the distance Lx in the X-direction between the first and second photo-resist pattern center positions C31 and C32 is shorter than what is obtained in the best focus state. The best focus position can be obtained on the basis of the peak of the distance Lx in the X-direction between the first and second photo-resist pattern center positions C31 and C32.

The described second novel measuring mask M has the plural second measuring patterns P2, each of which has the second straight line parts P2 only but free of the first straight line parts P1 of the first measuring pattern P1 in the first embodiment. The second novel measuring pattern P2 is more simple than the first novel measuring pattern P1. Accordingly, the best focus and the defocus of the measuring pattern P1 can automatically be detected from the detection of the signal variation by the pattern recognition apparatus without any manual operation using the microscopes. The novel measuring mask M and the novel measuring method are free from the above described problems engaged with the above described prior art.

Third Embodiment

Figure 16:
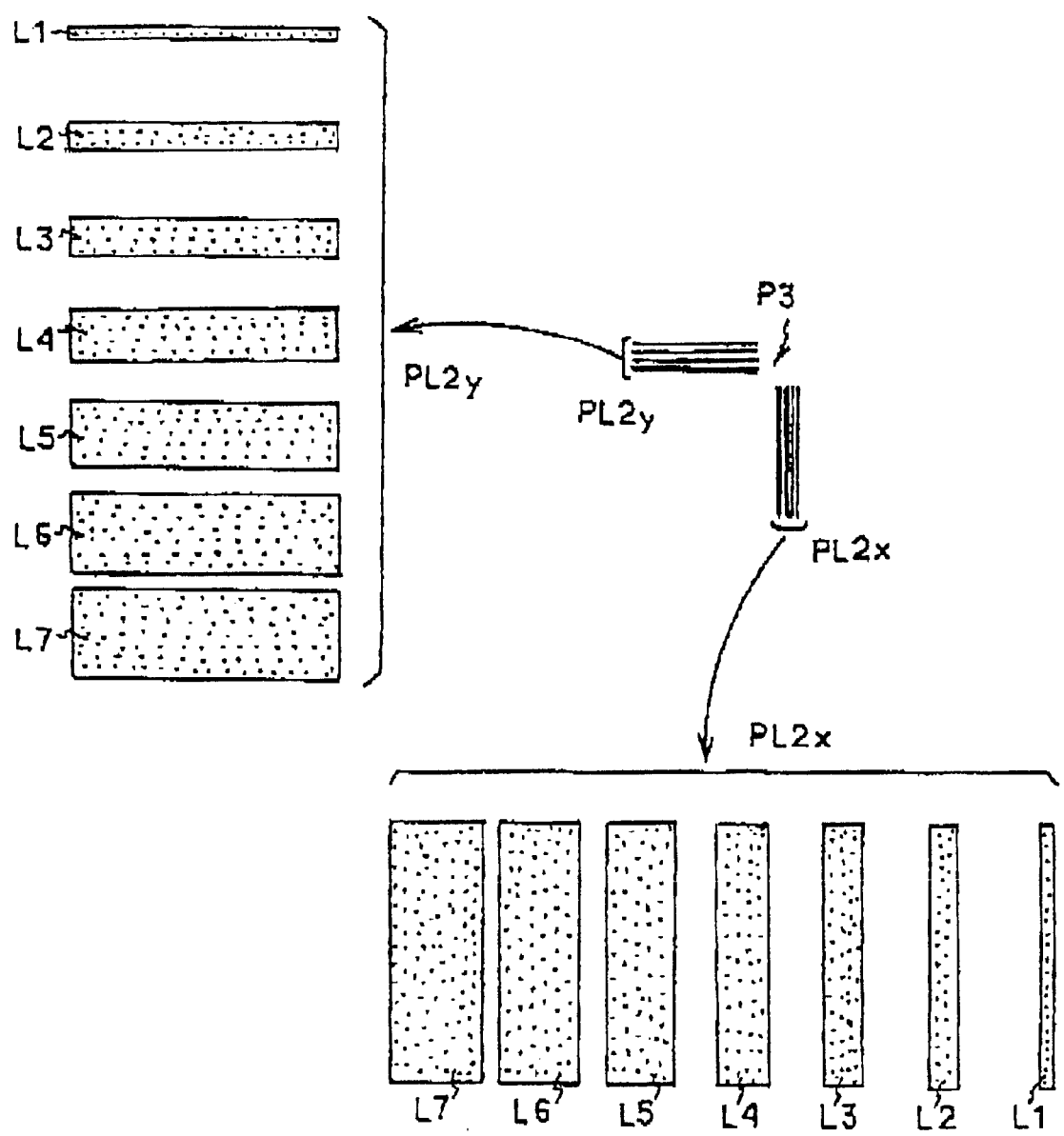
FIG. 16 is a view illustrative of one of plural measuring patterns of a third novel measuring mask M, and also illustrative with enlargement of the second straight line parts in accordance with the present invention.

A third embodiment according to the present invention will be described in detail with reference to the drawings. FIG. 16 is a view illustrative of one of plural measuring patterns of a third novel measuring mask M, and also illustrative with enlargement of the second straight line parts in accordance with the present invention. The novel measuring mask M has a uniform distribution of plural measuring patterns P3. The uniform distribution of the plural measuring patterns P3 may, for example, comprise a matrix array of nine measuring patterns P3. Each of the measuring patterns P3 may comprise a metal foil pattern of a light-shielding metal such as chromium over the surface of the body of the measuring mask M. Each of the measuring patterns P3 further comprises two second straight line parts PL2x and PL2y, wherein the second straight line part PL2y is directed in the X-direction, and the remaining second straight line part PL2x is directed in the Y-direction perpendicular to the X-direction. The second straight line parts PL2x and PL2y are placed along adjacent two sides of a square. Each of the measuring patterns P3 has a shape of square which comprises adjacent two sides which comprise the two second straight line parts PL2x and PL2y Each of the two second straight line parts PL2x and PL2y comprises plural straight line segments different in width, for example, first to seventh straight line segments L1 to L7 having first to seventh widths which are different from each other. The plural straight line segments, for example, first to seventh straight line segments L1 to L7 have a uniform longitudinal direction. The plural straight line segments, for example, first to seventh straight line segments L1 to L7 are aligned in a direction perpendicular to the uniform longitudinal direction at a constant pitch Pt. The first straight line segment L1 of each of the two second straight line parts PL2x and PL2y has a first width which is narrowest in all of the straight line segments of the second straight line part PL2 The second straight line segment L2 of each of the two second straight line parts PL2x and PL2y has a second width which is second narrower to the first width of the first straight line segment L1. The third straight line segment L3 of each of the two second straight line parts PL2x and PL2y has a third width which is third narrower to the second width of the second straight line segment L2. The second width of the second straight line segment L2 is narrower than the third width of the third straight line segment L3 and wider than the first width of the first straight line segment L1. The fourth straight line segment L4 of each of the two second straight line parts PL2x and PL2y has a fourth width which is fourth narrower to the third width of the third straight line segment L3. The third width of the third straight line segment L3 is narrower than the fourth width of the fourth straight line segment L4 and wider than the second width of the second straight line segment L2. The fifth straight line segment L5 of each of the two second straight line parts PL2x and PL2y has a fifth width which is fifth narrower to the, fourth width of the fourth straight line segment L4 and namely the fifth width is third wider. The fourth width of the fourth straight line segment L4 is narrower than the fifth width of the fifth straight line segment L5 and wider than the third width of the third straight line segment L3. The sixth straight line segment L6 of each of the two second straight line parts PL2x and PL2y has a sixth width which is sixth narrower to the fifth width of the fifth straight line segment L5 and namely the sixth width is second wider. The fifth width of the fifth straight line segment L5 is narrower than the sixth width of the sixth straight line segment L6 and wider than the fourth width of the fourth straight line segment L4. The seventh straight line segment L7 of each of the two second straight line parts PL2x and PL2y has a seventh width which is seventh narrower to the sixth width of the sixth straight line segment L6 and namely the seventh width is the widest in all of the straight line segments of the second straight line part PL2. The sixth width of the sixth straight line segment L6 is narrower than the seventh width of the seventh straight line segment L7 and wider than the fifth width of the fifth straight line segment L5. Accordingly, the first to seventh straight line segments L1, L2, L3, L4, L5, L6 and L7 are aligned in the order of the width thereof from the narrowest width to the widest width, however, at the constant pitch Pt and at various gaps between adjacent ones of the first to seventh straight line segments L1, L2, L3, L4, L5, L6 and L7. The widths of the seven straight line segments vary to increase in the direction from the first straight line segment L1 to the seventh straight line segment L7, whilst the gaps between the seven straight line segments vary to decrease in the direction from the first straight line segment L1 to the seventh straight line segment L7, provided that the alignment pitch of the seven straight line segments remains unchanged. The rate of increase in width from the first straight line segment L1 to the seventh straight line segment L7 of each of the two second straight line parts PL2x and PL2y may be constant, For example, the first width of the first straight line segment L1 of each of the two second straight line parts PL2x and PL2y may, for example, be 0.1 micrometers. The second width of the second straight line segment L2 of each of the two second straight line parts PL2x and PL2y may, for example, be 0.15 micrometers. The third width of the third straight line segment L3 of each of the two second straight line parts PL2x and PL2y may, for example, be 0.2 micrometers. The fourth width of the fourth straight line segment L4 of each of the two second straight line parts PL2x and PL2y may, for example, be 0.25 micrometers. The fifth width of the fifth straight line segment L5 of each of the two second straight line parts PL2x and PL2y may, for example, be 0.3 micrometers. The sixth width of the sixth straight line segment L6 of each of the two second straight line parts PL2x and PL2y may, for example, be 0.35 micrometers. The seventh width of the seventh straight line segment L7 of each of the two second straight line parts PL2x and PL2y may, for example, be 0.4 micrometers. The constant pitch may be set at 0.5 micrometers.

As described above, the novel measuring mask M has the uniform distribution of the plural measuring patterns P3. The uniform distribution of the plural measuring patterns P3 may, for example, comprise the matrix array of the nine measuring patterns P3. It is, of course, possible as a modification that the uniform distribution of the plural measuring patterns P3 may comprise a concentrically circulated distribution having a center corresponding to the optical axis of the above target projection optical system 109. It is further possible as a modification that the uniform distribution of the plural measuring patterns P3 may comprise a radial distribution from a center corresponding to the optical axis of the above target projection optical system 109. Namely, it is possible as a modification that the uniform distribution of the plural measuring patterns P3 may comprise a distribution symmetrical with the optical axis of the above target projection optical system 109.

A method of measuring the even function aberration by use of the above described novel measuring mask M will subsequently be described The novel measuring mask M is placed on the mask stage 107 of the projection exposure system 100. The photo-resist applied measuring wafer W having the surface applied with the photo-resist film is also placed on the wafer stage 109. The light is illuminated through the lighting optical system 106 onto the measuring mask M having the measuring pattern P1, so that the light having the measuring pattern P1 is further transmitted through the reducing projection optical system 109 and focused onto the photo-resist film over the measuring wafer W, whereby the photo-resist film over the measuring wafer W is exposed to the focused light with the size-reduced measuring pattern. During this exposure process, the wafer stage 109 is placed under the two-dimensional movements both in the X-direction and in the Y-direction, so that the exposing position over the photo-resist film over the measuring wafer W is moved in the X-direction and the Y-direction. Further, during this exposure process, the wafer stage 109 is varied in the Z-direction parallel to the optical axis of the projection optical system 109 by a fine scale unit in a small range including a presumed best focus position. The fine scale unit may, for example, be 0.1 micrometer. The small range may, for example, be −1.0 micrometer to +1.0 micrometer. The exposures are made plural times to form plural exposed parts of the photo-resist film over the measuring wafer W.

Subsequent to the exposure process, a development of the exposed photo-resist film is made to form plural photo-resist patterns PP which correspond to the size-reduced measuring patterns P1 of the measuring mask M with various focus positions. As a result, there is formed alignments of the plural photo-resist patterns PP in a direction perpendicular to the orientation flat "OF" of the measuring wafer W, wherein each alignment comprises the plural photo-resist patterns PP which are different in focus position in the Z-direction, namely different in the Z-directional position of the measuring wafer W over the wafer stage 109 under the fine movement in the Z-direction. The measuring wafer W having the photo-resist patterns PP is then placed in a pattern recognition apparatus which is not illustrated for measurement to the photo-resist patterns PP The pattern recognition apparatus irradiates an optical beam onto the photo-resist patterns PP with scanning operation over the measuring wafer W. The irradiated light onto the photo-resist patterns PP is reduced in intensity. The reflected light from the photo-resist patterns PP is lower in intensity than the reflected light from the surface of the measuring wafer W. The pattern recognition apparatus detects the intensity or the quantity of photon of the reflected light to measure the width or size of the each photo-resist pattern PP in the direction along which the light beam is scanned by the pattern recognition apparatus. As a result of the integration of the measured data, the pattern recognition is made.

The pattern recognition apparatus irradiates the light beam LB onto the surface of the measuring wafer W, wherein the light beam LB is scanned in the X-direction across over the photo-resist patterns PL2x and PL2y, each of which comprises the first to seventh straight line segment photo-resist patterns L1, L2, L3, L4, L5, L6 and L7 in case of the best focus. The light beam LB is reflected from the surface of the measuring wafer W and the reflected light is received by the pattern recognition apparatus, and the reflected light beam LB is detected as a signal S by the pattern recognition apparatus. A first type reflected light reflected from the photo-resist patterns PL2x and PL2y is lower in intensity than a second type reflected light reflected from the surface of the measuring wafer W. Namely, when the light beam LB on scanning operation in the X-direction is irradiated onto the photo-resist pattern PL2x, then the detected signal S is low level. If the light beam LB on scanning operation in the X-direction is irradiated onto the surface of the measuring wafer W, then the detected signal S is high level. If the exposure was made in the best focus state, then the photo-resist patterns PL2x and PL2y are free of any deformation or any distortion in shape from the straight line segments of the second straight line parts PL2x and PL2y. Each of the photo-resist patterns PL2x and PL2y comprises the first to seventh photo-resist pattern straight line segments L1, L2, L3, L4, L5, L6 and L7. A first photo-resist pattern center position in the X-direction of the photo-resist pattern PL2x can be calculated from the low level timing of the detected signal S in the scanning operation in the X-direction across the photo-resist pattern PL2x. A second photo-resist pattern center position in the X-direction of the photo-resist pattern PL2y can be calculated from the low level timing of the detected signal S in the scanning operation in the X-direction across the photo-resist pattern PL2y. If the exposure was realized in the best focus state, then the first and second center positions are most outside. Namely, the exposure was realized in the best focus state, then the photo-resist patterns PL2x and PL2y are free of any deformation or distortion in shape from the second straight line parts PL2x and PL2y. For this reason, if the exposure was realized in the best focus state, then the first and second center positions are most outside.

The pattern recognition apparatus irradiates the light beam LB onto the surface of the measuring wafer W, wherein the light beam LB is scanned in the X-direction across over the second type photo-resist patterns PL2L and PL2R, each of which comprises the third to seventh straight line segment photo-resist patterns L3, L4, L5, L6 and L7 in the defocus state. The light beam LB is reflected from the surface of the measuring wafer W and the reflected light is received by the pattern recognition apparatus, and the reflected light beam LB is detected as a signal S by the pattern recognition apparatus. A first type reflected light reflected from the photo-resist patterns PL2x and PL2y is lower in intensity than a second type reflected light reflected from the surface of the measuring wafer W. Namely, when the light beam LB on scanning operation in the X-direction is irradiated onto the photo-resist patterns PL2x and PL2y, then the detected signal S is low level. If the light beam LB on scanning operation in the X-direction is irradiated onto the surface of the measuring wafer W, then the detected signal S is high level. A first photo-resist pattern center position in the X-direction of the photo-resist pattern PL2x can be calculated from the low level timing of the detected signal S in the scanning operation in the X-direction across the photo-resist pattern PL2x. A second photo-resist pattern center position in the X-direction of the photo-resist pattern PL2y can be calculated from the low level timing of the detected signal S in the scanning operation in the Y-direction across the photo-resist pattern PL2y. Namely, the exposure was made in the remarkable defocus state, then the photo-resist patterns PL2x and PL2y include a certain deformation or a certain distortion in shape from the straight line segments of the second straight line parts PL2x and PL2y. Particularly, the slender straight line segments of the second straight line art PL2x and PL2y, for example, the first and second straight line segments L1 and L2 of the second straight line parts PL2x and PL2y are likely to cause dispersion of the exposing light beam due in the remarkable defocus state, whereby the intensity of the exposing light beam to the photo-resist film is reduced. As a reduction in the intensity of the exposing light beam, it is possible that the first and second straight line segments L1 and L2 of the second straight line parts PL2x and PL2y are not projected onto the photo-resist film and the first and second straight line segment photo-resist patterns L1 and L2 are not formed over the measuring wafer W, even the remaining third to seventh straight line segment photo-resist patterns L3, L4, L5, L6 and L7 are formed over the measuring wafer W. Since the first and second straight line segment photo-resist patterns L1 and L2 are not formed, then each of the photo-resist patterns PL2x and PL2y comprises the third to seventh straight line segment photo-resist patterns L3, L4, L5, L6 and L7 and is free of the first and second straight line segment photo-resist patterns L1 and L2. The width of each of the photo-resist patterns PL2x and PL2y is thus defined between the outer edge of the third straight line segment photo-resist pattern L3 and the outer edge of the seventh straight line segment photo-resist pattern L7. Further, the extent in the X-direction of the photo-resist pattern PL2x is defined by the outer edge position of the third straight line segment photo-resist pattern L3 and the outer edge position of the seventh straight line segment photo-resist pattern L7. The extent in the Y-direction of the photo-resist pattern PL2y is defined by the outer edge position of the third straight line segment photo-resist pattern L3 and the outer edge position of the seventh straight line segment photo-resist pattern L7. Namely, since each of the photo-resist patterns PL2x and PL2y is exclusive of the first and second straight line segment photo-resist patterns L1 and L2, the extents in the X-direction and the Y-direction of the photo-resist patterns PL2x and PL2y are largely different from what are obtained in the best focus state. Thus, the calculated first and second center positions are largely displaced and different from the center positions calculated in the case of the best focus state. For this reason, if the exposure was made in the remarkable defocus state, then the first and second center positions are largely different from what are obtained in the best focus state. Namely, the exposure was realized in the defocus state, then each of the photo-resist patterns PL2x and PL2y includes a certain deformation or a distortion in shape from the second straight line parts. For this reason, if the exposure was realized in the defocus state, then the first and second photo-resist pattern center positions are displaced from what are obtained in the best focus state.

The displacements of first and second photo-resist pattern center positions depend on the magnitude of the defocus. If the exposure was made in the best focus state, then the displacements of first and second photo-resist pattern center positions is zero. If the exposure was made in the defocus state, then the displacements of first and second photo-resist pattern center positions is not zero. The best focus position can be obtained on the basis of the first and second photo-resist pattern center positions.

The described third novel measuring mask M has the plural second measuring patterns P3, each of which has the two second straight line parts P2 only but free of the first straight line parts P1 of the first measuring pattern P1 in the first embodiment. The third novel measuring pattern P3 is more simple than the first novel measuring pattern P1. Accordingly, the best focus and the defocus of the measuring pattern P3 can automatically be detected from the detection of the signal variation by the pattern recognition apparatus without any manual operation using the microscopes. The novel measuring mask M and the novel measuring method are free from the above described problems engaged with the above described prior art.

Fourth Embodiment

Figure 17:
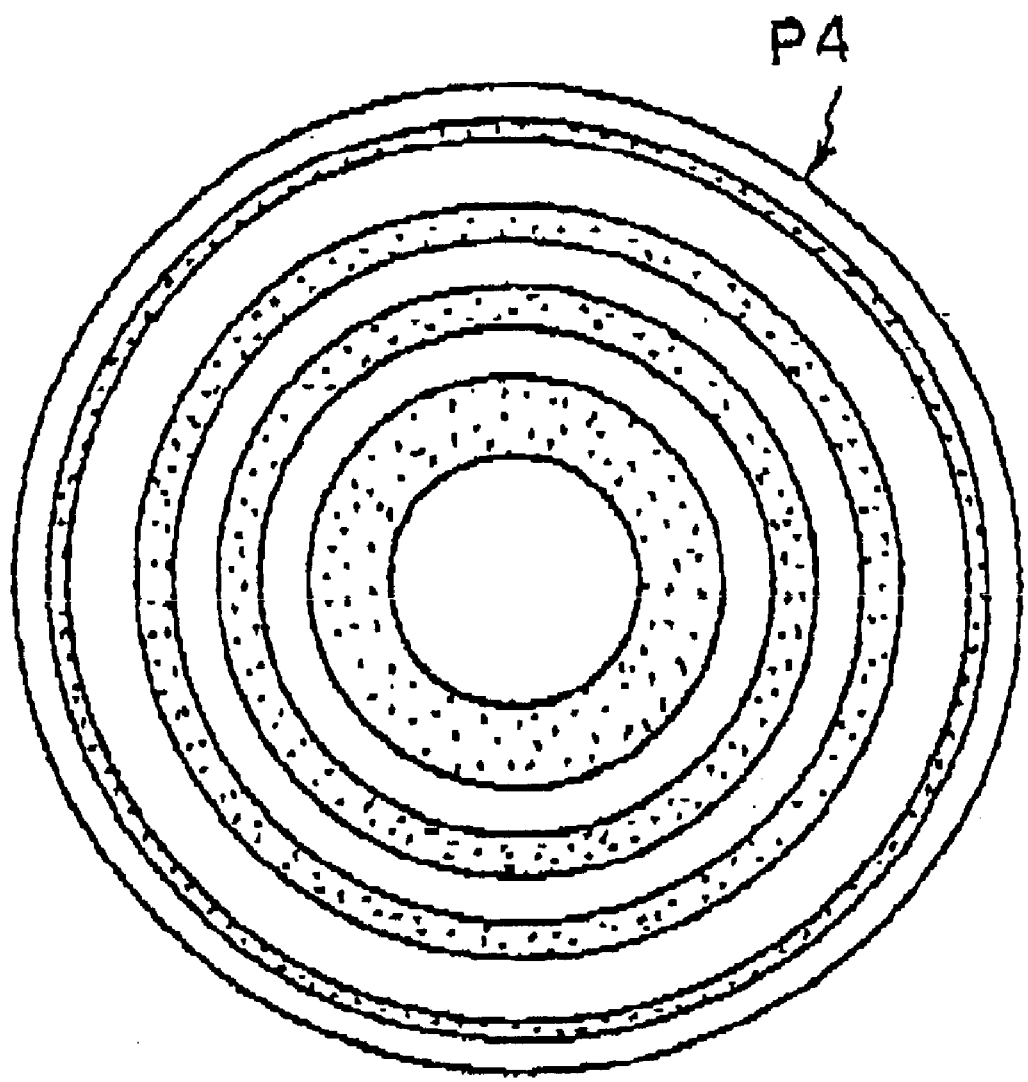
FIG. 17 is a plane view illustrative of a fourth novel measuring pattern P4 as one of the plural measuring patterns of the measuring mask M in a fourth embodiment in accordance with the present invention.

A fourth embodiment according to the present invention will be described in detail with reference to the drawings. FIG. 17 is a plane view illustrative of a fourth novel measuring pattern P4 as one of the plural measuring patterns of the measuring mask M in a fourth embodiment in accordance with the present invention. Each of the fourth measuring patterns P4 comprises plural coaxially-aligned circular rings different in width from each other, provided that an individual width of each of said plural co-axially-aligned width-different looped lines is unchanged. The widths of the plural co-axially-aligned width-different circular rings are simply decreased in radially outward direction. Namely, the outermost circular ring is narrowest in width, whilst the innermost circular ring is widest in width. If the exposure was made in the best focus state, then all of the plural co-axially-aligned width-different circular rings are well projected onto the photo-resist film and plural co-axially-aligned width-different circular ring photo-resist patterns are formed over the measuring wafer. If, however, the exposure was made in the defocus state, then only the wider circular rings are projected onto the photo-resist film and the wider circular ring photo-resist patterns are formed over the measuring wafer, wherein the narrower circular ring is not projected onto the photo-resist film and the photo-resist patterns are free of the narrow circular ring photo-resist pattern which corresponds to the narrower circular ring. The pattern recognition process is also carried out in the same manner as described in the foregoing embodiments for recoding the photo-resist patterns over the measuring wafer, whereby an outermost diameter of the circular ring photo-resist patterns can be detected on the basis of the pattern recognition signal. Thus, the diameter of the circular ring photo-resist patterns is maximum when the exposure was made in the best focus state. If the exposure was made in the defocus state, the diameter of the circular ring photo-resist patterns is smaller than the maximum diameter obtained in the best focus state. The best focus position can be detected on the basis of the detected diameter of the circular ring photo-resist patterns.

Accordingly, the best focus and the defocus of the measuring pattern P4 can automatically be detected from the detection of the signal variation by the pattern recognition apparatus without any manual operation using the microscopes. The novel measuring mask M and the novel measuring method are free from the above described problems engaged with the above described prior art.

Fifth Embodiment

A fifth embodiment according to the present invention will be described in detail with reference to the drawings.

Figure 18:
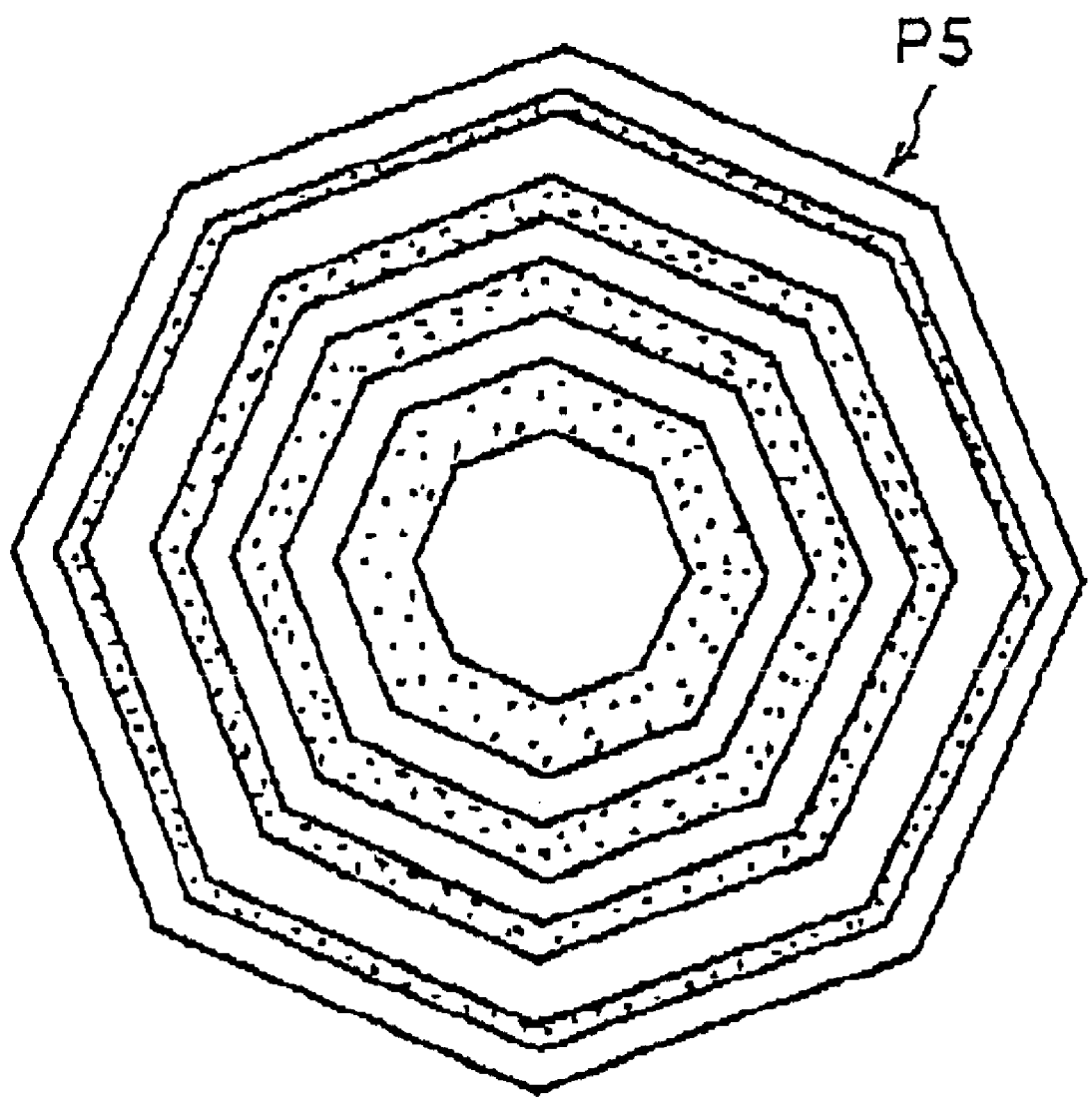
FIG. 18 is a plane view illustrative of a fourth novel measuring pattern P5 as one of the plural measuring patterns of the measuring mask M in a fifth embodiment in accordance with the present invention.

FIG. 18 is a plane view illustrative of a fourth novel measuring pattern P5 as one of the plural measuring patterns of the measuring mask M in a fifth embodiment in accordance with the present invention. Each of the fourth measuring patterns P5 comprises plural coaxially-aligned hexagonal rings different in width from each other, provided that an individual width of each of said plural co-axially-aligned width-different looped lines is unchanged. The widths of the plural co-axially-aligned width-different hexagonal rings are simply decreased in radially outward direction. Namely, the outermost hexagonal ring is narrowest in width, whilst the innermost hexagonal ring is widest in width. If the exposure was made in the best focus state, then all of the plural co-axially-aligned width-different hexagonal rings are well projected onto the photo-resist film and plural co-axially-aligned width-different hexagonal ring photo-resist patterns are formed over the measuring wafer. If, however, the exposure was made in the defocus state, then only the wider hexagonal rings are projected onto the photo-resist film and the wider hexagonal ring photo-resist patterns are formed over the measuring wafer, wherein the narrower hexagonal ring is not projected onto the photo-resist film and the photo-resist patterns are free of the narrow hexagonal ring photo-resist pattern which corresponds to the narrower hexagonal ring. The pattern recognition process is also carried out in the same manner as described in the foregoing embodiments for recognizing the photo-resist patterns over the measuring wafer, whereby an outermost diameter of the hexagonal ring photo-resist patterns can be detected on the basis of the pattern recognition signal. Thus, the diameter of the hexagonal ring photo-resist patterns is maximum when the exposure was made in the best focus state. If the exposure was made in he defocus state, the diameter of the hexagonal ring photo-resist patterns is smaller than the maximum diameter obtained in the best focus state. The best focus position can be detected on the basis of the detected diameter of the hexagonal ring photo-resist patterns.

Accordingly, the best focus and the defocus of the measuring pattern P5 can automatically be detected from the detection of the signal variation by the pattern recognition apparatus without any manual operation using the microscopes. The novel measuring mask M and the novel measuring method are free from the above described problems engaged with the above described prior art.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of measuring an optical aberration of a target projecting optical system by use of a measuring mask having measuring patterns, wherein each of said measuring patterns comprises plural pattern parts being separated from each other, and said plural pattern parts provide individual widths which are simply increased on first and second directional axes non-parallel to each other and vertical to a plane of said mask, provided that said width of each of said plural pattern parts is unchanged at least on the first and second directional axes, and wherein said method comprising the steps of:
projecting said measuring patterns of said measuring mask through said target projecting optical system onto a resist film over a measuring wafer to form photo-resist patterns representing said plural pattern parts over said measuring wafer;
carrying out a pattern recognition of said photo-resist patterns by irradiating a light beam onto said measuring wafer with scannings in both first and second directions parallel to said first and second directional axes to obtain pattern recognition signals for said photo-resist patterns;
calculating best focus positions on the basis of said pattern recognition signals; and
calculating said optical aberration of said target optical system on the basis of said best focus positions.

2. The method as claimed in claim 1, wherein said optical aberration is at least one of even function aberrations.

3. The method as claimed in claim 2, wherein said optical aberration is an astigmation aberration.

4. The method as claimed in claim 2, wherein said optical aberration is an image plane distortion.

5. The method as claimed in claim 2, wherein said optical aberration is a spherical aberration.

6. The method as claimed in claim 1, wherein said mask includes plural measuring patterns having a generally uniform distribution over said mask.

7. The method as claimed in claim 6, wherein said plural measuring patterns are arranged in matrix over said mask.

8. The method as claimed in claim 6, wherein said plural measuring patterns are arranged in symmetrical with reference to a center point of said mask.

9. The method as claimed in claim 1, wherein said plural pattern parts include plural sets of plural width-different parallel straight line segments,
provided that said plural width-different parallel straight line segments of a first set are aligned in a first direction parallel to said first directional axis, and each of said plural width-different parallel straight line segments of said first set extend in a second direction parallel to said second directional axis, and said widths of said plural width-different parallel straight line segments of said first set are simply increased in said first direction, and
provided that said plural width-different parallel straight line segments of a second set are aligned in said second direction parallel to said second directional axis, and each of said plural width-different parallel straight line segments of said second set extend in said first direction parallel to said first directional axis, and said widths of said plural width-different parallel straight line segments of said second set are simply increased in said second direction.

10. The method as claimed in claim 9, wherein said mask includes said plural measuring patterns, and a pitch for alignment of said plural width-different parallel straight line segments of said first set in said first direction is constant for each of said plural measuring patterns and the same among said plural measuring patterns, and a pitch for alignment of said plural width-different parallel straight line segments of said second set in said second direction is also constant for each of said plural measuring patterns and the same among said plural measuring patterns.

11. The method as claimed in claim 9, wherein said mask includes said plural measuring patterns, and a pitch for alignment of said plural width-different parallel straight line segments of said first set in said first direction is constant for each of said plural measuring patterns and different among said plural measuring patterns, and a pitch for alignment of said plural width-different parallel straight line segments of said second set in said second direction is also constant for each of said plural measuring patterns and different among said plural measuring patterns.

12. The method as claimed in claim 9, wherein said plural sets of said plural width-different parallel straight line segments comprise four sets of said plural width-different parallel straight line segments which are arranged to form four sides of a square of said measuring pattern, and said first and second directional axes are perpendicular to each other.

13. The method as claimed in claim 12, wherein said mask includes said plural measuring patterns, and a pitch for alignment of said plural width-different parallel straight line segments of said first set in said first direction is constant for each of said plural measuring patterns and the same among said plural measuring patterns, and a pitch for alignment of said plural width-different parallel straight line segments of said second set in said second direction is also constant for each of said plural measuring patterns and the same among said plural measuring patterns.

14. The method as claimed in claim 12, wherein said mask includes said plural measuring patterns, and a pitch for alignment of said plural width-different parallel straight line segments of said first set in said first direction is constant for each of said plural measuring patterns and different among said plural measuring patterns, and a pitch for alignment of said plural width-different parallel straight line segments of said second set in said second direction is also constant for each of said plural measuring patterns and different among said plural measuring patterns.

15. The method as claimed in claim 12, wherein said plural width-different parallel straight line segments of a first pair of said four sets are arranged along first opposite sides of said square, and said first opposite sides extend in said first direction parallel to said first directional axis and said first opposite sides are distanced in said second direction parallel to said second directional axis, and said widths of said plural width-different parallel straight line segments of said first pair are increased in the same direction parallel to said first direction, and wherein said plural width-different parallel straight line segments of a second pair of said four sets are arranged along second opposite sides of said square, and said second opposite sides extend in said second direction parallel to said second directional axis and said second opposite sides are distanced in said first direction parallel to said first directional axis, and said widths of said plural width-different parallel straight line segments of said second pair are increased in the same direction parallel to said second direction.

16. The method as claimed in claim 15, wherein said measuring pattern further comprises four outer broad straight line segments in addition to said four sets of said plural width-different parallel straight line segments, wherein said four outer broad straight line segments respectively extend in parallel to said four sides of said square, and each of said four outer broad straight line segments extends outside of and in parallel to corresponding one set of said plural width-different parallel straight line segments, so that said four outer broad straight line segments form an outer square which surrounds said square of said four sets of said plural width-different parallel straight line segments, provided that each of said four outer broad straight line segments has a broader width than any of said plural width-different parallel straight line segments.

17. The method as claimed in claim 12, wherein said plural width-different parallel straight line segments of a first pair of said four sets are arranged along first opposite sides of said square, and said first opposite sides extend in said first direction parallel to said first directional axis and said first opposite sides are distanced in said second direction parallel to said second directional axis, and said widths of said plural width-different parallel straight line segments of said first pair are increased in opposite directions to each other and parallel and anti-parallel to said first direction, and wherein said plural width-different parallel straight line segments of a second pair of said four sets are arranged along second opposite sides of said square, and said second opposite sides extend in said second direction parallel to said second directional axis and said second opposite sides are distanced in said first direction parallel to said first directional axis, and said widths of said plural width-different parallel straight line segments of said second pair are increased in opposite directions to each other and parallel and anti-parallel to said second direction.

18. The method as claimed in claim 9, wherein said plural sets of said plural width-different parallel straight line segments comprise two sets of said plural width-different parallel straight line segments which are arranged to form adjacent two sides of a square of said measuring pattern, and said first and second directional axes are perpendicular to each other.

19. The method as claimed in claim 18, wherein said mask includes said plural measuring patterns, and a pitch for alignment of said plural width-different parallel straight line segments of said first set in said first direction is constant for each of said plural measuring patterns and the same among said plural measuring patterns, and a pitch for alignment of said plural width-different parallel straight line segments of said second set in said second direction is also constant for each of said plural measuring patterns and the same among said plural measuring patterns.

20. The method as claimed in claim 18, wherein said mask includes said plural measuring patterns, and a pitch for alignment of said plural width-different parallel straight line segments of said first set in said first direction is constant for each of said plural measuring patterns and different among said plural measuring patterns, and a pitch for alignment of said plural width-different parallel straight line segments of said second set in said second direction is also constant for each of said plural measuring patterns and different among said plural measuring patterns.

21. The method as claimed in claim 1, wherein said plural pattern parts include plural co-axially-aligned width-different looped lines, provided that an individual width of each of said plural co-axially-aligned width-different looped lines is unchanged.

22. The method as claimed in claim 21, wherein widths of said plural co-axially-aligned width-different looped lines are simply decreased in radially outward direction.

23. The method as claimed in claim 21, wherein each of said plural co-axially-aligned width-different looped lines has a circular ring shape.

24. The method as claimed in claim 21, wherein each of said plural co-axially-aligned width-different looped lines has a polygonal ring shape.

25. The method as claimed in claim 24, wherein each of said plural co-axially-aligned width-different looped lines has a hexagonal ring shape.

26. The method as claimed in claim 25, wherein said first and second directional axes extend to make an included angle of 45 degrees.

27. The method as claimed in claim 5, wherein said first and second directional axes extend to make an included angle of 22.5 degrees.

* * * * *